United States Patent
Choi et al.

(10) Patent No.: US 11,677,353 B2
(45) Date of Patent: Jun. 13, 2023

(54) VARIABLE CAPACITOR CIRCUIT AND DIGITALLY-CONTROLLED OSCILLATOR INCLUDING THE SAME

(71) Applicant: Samsung Electronics Co., Ltd., Suwon-si (KR)

(72) Inventors: Yongchang Choi, Seongnam-si (KR); Sungjoon Park, Osan-si (KR); Hyoeun Park, Hwaseong-si (KR); Youngchang An, Seoul (KR); Hyotae Choo, Yongin-si (KR); Somin Lee, Cheonan-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/539,408

(22) Filed: Dec. 1, 2021

(65) Prior Publication Data

US 2022/0311382 A1   Sep. 29, 2022

(30) Foreign Application Priority Data

Mar. 29, 2021   (KR) .................. 10-2021-0040437

(51) Int. Cl.
*H03B 5/12*   (2006.01)

(52) U.S. Cl.
CPC ......... *H03B 5/1206* (2013.01); *H03B 5/1253* (2013.01); *H03B 2200/004* (2013.01); *H03B 2200/0086* (2013.01)

(58) Field of Classification Search
CPC ...... H03B 5/12; H03B 5/1206; H03B 5/1212; H03B 5/1215; H03B 5/1228; H03B 5/1231; H03B 5/124; H03B 5/1243; H03B 5/1246; H03B 5/125; H03B 5/1253; H03B 5/366; H03B 5/368; H03B 2200/004

See application file for complete search history.

(56) References Cited

U.S. PATENT DOCUMENTS

| | | | |
|---|---|---|---|
| 6,906,596 B2 | 6/2005 | Kitamura et al. | |
| 7,129,801 B2* | 10/2006 | Wu | H03L 7/099 331/177 V |
| 7,183,870 B2* | 2/2007 | Takagi | H03B 5/1231 331/177 V |
| 7,336,134 B1* | 2/2008 | Janesch | H03L 7/0995 331/177 V |
| 7,449,970 B2 | 11/2008 | Yu et al. | |
| 8,502,614 B2* | 8/2013 | Nakamura | H03B 5/1296 331/181 |
| 8,803,616 B2* | 8/2014 | Zhang | H03L 7/104 331/177 V |
| 10,270,388 B2* | 4/2019 | Hoshino | H03B 5/1228 |

(Continued)

FOREIGN PATENT DOCUMENTS

KR   101255465 B1   4/2013

*Primary Examiner* — Levi Gannon
(74) *Attorney, Agent, or Firm* — Myers Bigel, P.A.

(57) ABSTRACT

A variable capacitor circuit includes a capacitor block including a first varactor element comprising a first transistor having a first size, a second varactor element comprising a second transistor having a second size different from the first size, a first terminal commonly connected to a source and a drain of the first transistor, a second terminal commonly connected to a source and a drain of the second transistor, and an RC circuit connected to a gate of the first transistor and a gate of the second transistor.

15 Claims, 23 Drawing Sheets

(56) References Cited

U.S. PATENT DOCUMENTS

| | | | |
|---|---|---|---|
| 2003/0189466 A1* | 10/2003 | Kitamura | H03B 5/1215 |
| | | | 331/100 |
| 2004/0150483 A1* | 8/2004 | Cho | H03B 5/1265 |
| | | | 331/117 R |
| 2004/0222838 A1 | 11/2004 | McCorquodale et al. | |
| 2007/0040625 A1* | 2/2007 | Yu | H03B 5/1243 |
| | | | 331/177 V |
| 2007/0075791 A1* | 4/2007 | Dedieu | H03B 5/04 |
| | | | 331/36 C |
| 2007/0103248 A1* | 5/2007 | Nakamura | H03D 3/007 |
| | | | 331/167 |
| 2007/0188244 A1 | 8/2007 | Waheed et al. | |
| 2008/0136544 A1 | 6/2008 | Tang | |
| 2010/0188158 A1 | 7/2010 | Ainspan et al. | |
| 2010/0214715 A1* | 8/2010 | Thaller | H03B 5/1253 |
| | | | 361/277 |
| 2012/0049913 A1 | 3/2012 | Tadjpour | |
| 2013/0147566 A1* | 6/2013 | Voinigescu | H03B 5/1231 |
| | | | 331/117 FE |
| 2018/0159471 A1 | 6/2018 | Zhang | |

\* cited by examiner

VARIABLE CAPACITOR CIRCUIT AND DIGITALLY-CONTROLLED OSCILLATOR INCLUDING THE SAME

CROSS-REFERENCE TO RELATED APPLICATION(S)

This application claims the benefit under 35 USC 119(a) of Korean Patent Application No. 10-2021-0040437 filed on Mar. 29, 2021 in the Korean Intellectual Property Office, the entire disclosure of which is incorporated herein by reference for all purposes.

FIELD

The present inventive concept relates to a variable capacitor circuit and related control circuits.

BACKGROUND

Variable capacitor circuits are circuits having a capacitance that varies according to voltage, and may include one or more varactor elements having a capacitance that varies linearly according to voltage. A variable capacitor circuit implemented in an analog manner using the capacitance of a varactor element that changes linearly according to voltage may have limits as to a capacitance range or reducing a capacitance difference that the circuit may provide, and/or may be vulnerable to factors such as variability in manufacturing processes and external noise.

SUMMARY

Example embodiments provide a variable capacitor circuit in which capacitance may be finely adjusted and a Q-factor may be improved in a high-frequency environment, and a digitally-controlled oscillator including the same.

According to example embodiments, a variable capacitor circuit includes a capacitor block including a first varactor element comprising a first transistor having a first size, a second varactor element comprising a second transistor having a second size different from the first size, a first terminal commonly connected to a source and a drain of the first transistor, and a second terminal commonly connected to a source and a drain of the second transistor. An RC circuit is connected to a gate of the first transistor and a gate of the second transistor.

According to example embodiments, a variable capacitor circuit includes a first varactor element comprising a first transistor having a first size and configured to operate responsive to a first control signal commonly applied to a source and a drain of the first transistor; and a second varactor element comprising a second transistor having a second size and configured to operate responsive to a second control signal commonly applied to a source and a drain of the second transistor. The second size is different from the first size, and the second control signal is a complementary signal of the first control signal.

According to example embodiments, a digital-controlled oscillator includes an inductor circuit connected to a first power node that is configured to supply a first power supply voltage; a current mirror circuit connected between the inductor circuit and a current circuit that is configured to supply a bias current; and a variable capacitor circuit connected between the current mirror circuit and the inductor circuit and having capacitance determined based on a control signal including digital data of N bits, where N is a natural number. The variable capacitor circuit includes a first transistor and a second transistor connected to each other in parallel, each of the first transistor and the second transistor comprising a gate connected to a node between the current mirror circuit and the inductor circuit, and a source and a drain configured to commonly receive the control signal. A first size of the first transistor is different from a second size of the second transistor.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION OF EMBODIMENTS

Hereinafter, various embodiments will be described in detail with reference to the accompanying drawings.

Figure 1A:
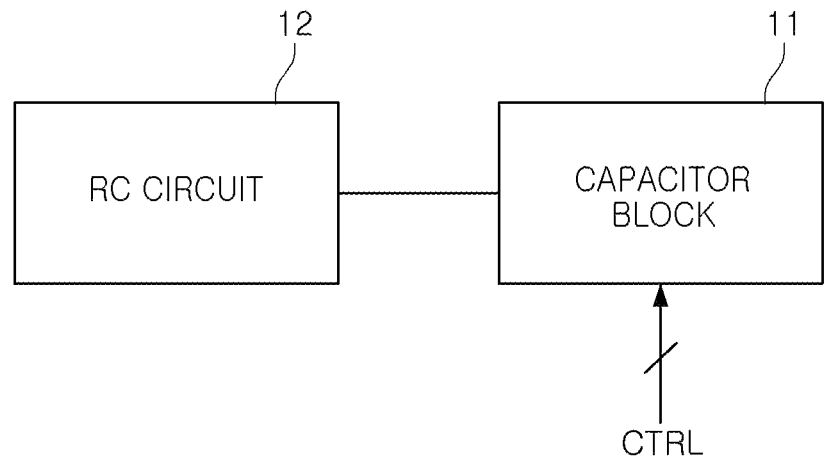
FIGS. 1A and 1B are diagrams illustrating a variable capacitor circuit according to an example embodiment.
Figure 1B:
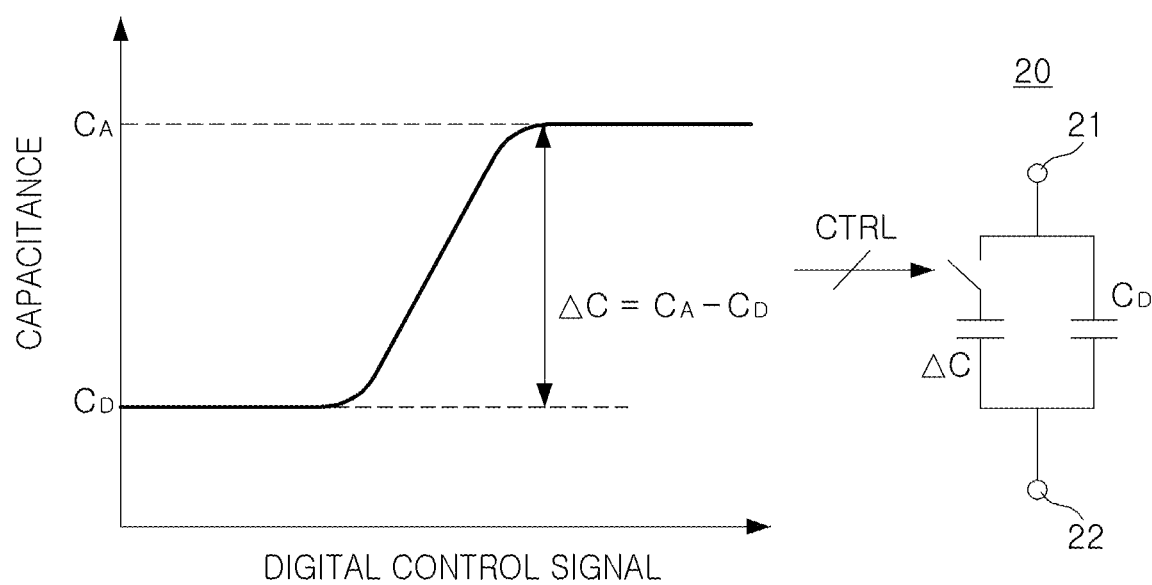

FIGS. 1A and 1B are diagrams illustrating a variable capacitor circuit according to an example embodiment.

Referring to FIG. 1A, a variable capacitor circuit 10 may include a capacitor block 11 and an RC circuit 12, the capacitor block 11 may include a plurality of varactor elements, and capacitance of each of the varactor elements may be determined or otherwise configured by a control signal CTRL. The variable capacitor circuit 10 may provide capacitance of various magnitudes determined by or based on the control signal CTRL, and may be applied to or used in various circuits, such as a Phase Locked Loop (PLL) circuit, an oscillator, a Digitally Controlled Delayed Line (DCDL) circuit, or the like.

The control signal CTRL may correspond to or carry digital data having a number of bits determined according to the number of varactor elements included in the capacitor block 11. For example, the capacitor block 11 may include 2N varactor elements, and the control signal CTRL may include N-bit digital data.

The RC circuit 12 may include at least one each of a capacitor and a resistor. In an example embodiment, the capacitor of the RC circuit 12 may be connected in series to the capacitor block 11, and a resistor may be connected between a node between the capacitor and the capacitor block 11 and a ground node. By connecting the RC circuit 12 to the capacitor block 11, the Q-factor may be improved.

FIG. 1B is a diagram provided to illustrate the operation of the varactor element included in the capacitor block 11. In an example embodiment, the varactor element may operate in a depletion mode and an accumulation mode. Referring to FIG. 1B, the depletion mode may correspond to a state in which the switch is turned off by the control signal CTRL, and in the depletion mode, the capacitance of the varactor element may have a minimum value $C_D$. On the other hand, the accumulation mode may correspond to a state in which the switch is turned on by the control signal CTRL, and the capacitance of the varactor element may have a maximum value $C_A$ in the accumulation mode.

A capacitance difference $\Delta C$ that may be controlled by the varactor element may be determined as a difference between the maximum value $C_A$ and the minimum value $C_D$ of the capacitance, as illustrated in the graph of FIG. 1B. In an example embodiment, the varactor element operates in a digital manner, and an operating mode of the varactor element may be selected as an accumulation mode or a depletion mode by the control signal CTRL. In contrast to some analog methods, the function of linearly adjusting the capacitance of the varactor element according to the magnitude of the voltage input to the varactor element may not be implemented.

In digital methods, since the capacitance of one varactor element is determined only by the maximum value $C_A$ or the minimum value $C_D$, it may be necessary to precisely design the transistors constituting the varactor element for fine capacitance control. However, as the size of the transistor gradually decreases and the process becomes finer, there may be a limit in reducing the capacitance difference $\Delta C$, which may lead to a decrease in the resolution of the capacitance adjustable by the variable capacitor circuit 10.

In an example embodiment, the variable capacitor circuit 10 capable of increasing the resolution of adjustable capacitance using two or more varactor elements is proposed. For example, a first varactor element and a second varactor element may be commonly connected to one RC circuit 12, and the first varactor element and the second varactor element may be implemented with transistors of different sizes (e.g., based on channel length, channel width, number of fin structures, etc.) and/or other different characteristics such that the first and second varactor elements provide different capacitances. The terms first, second, etc. may be used herein merely to distinguish one element from another. When the first varactor element is in the depletion mode, the second varactor element operates in the accumulation mode, and when the first varactor element is in the accumulation mode, the second varactor element operates in the depletion mode. Since the adjustable capacitance difference $\Delta C$ is determined by the difference in size of transistors providing the first varactor element and the second varactor element, the variable capacitor circuit 10 capable of finely adjusting the capacitance while significantly reducing an increase in process difficulty may be implemented.

Figure 2A:
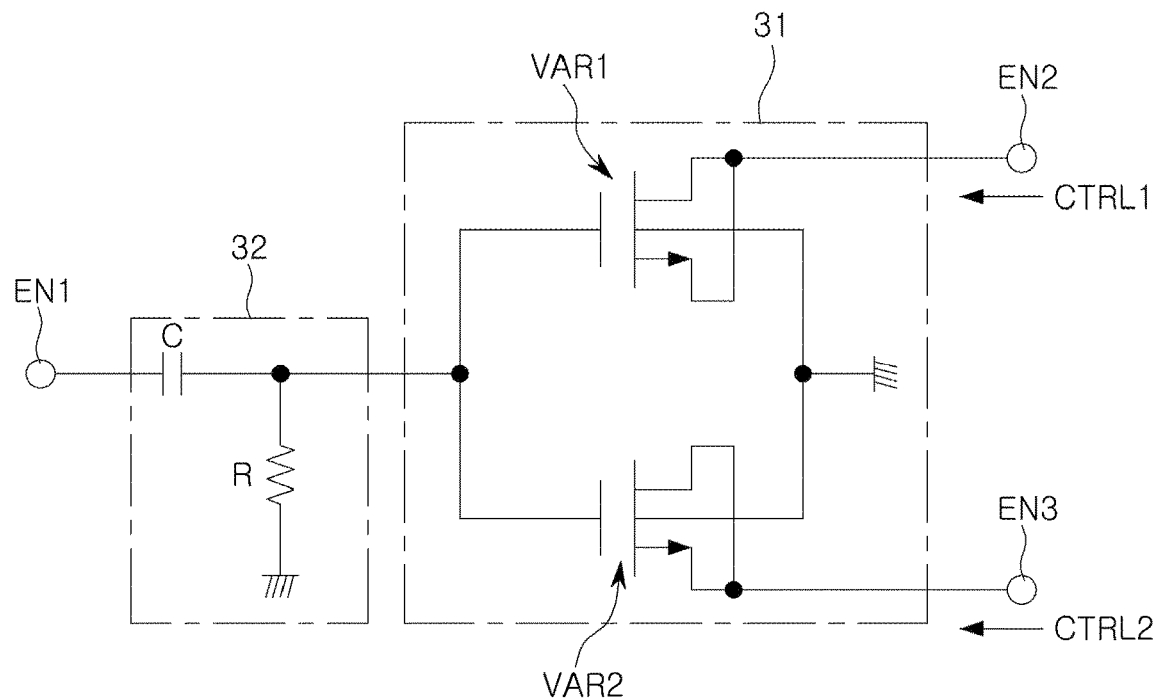
FIGS. 2A, 2B, and 2C are circuit diagrams schematically illustrating a variable capacitor circuit according to an example embodiment.
Figure 2B:
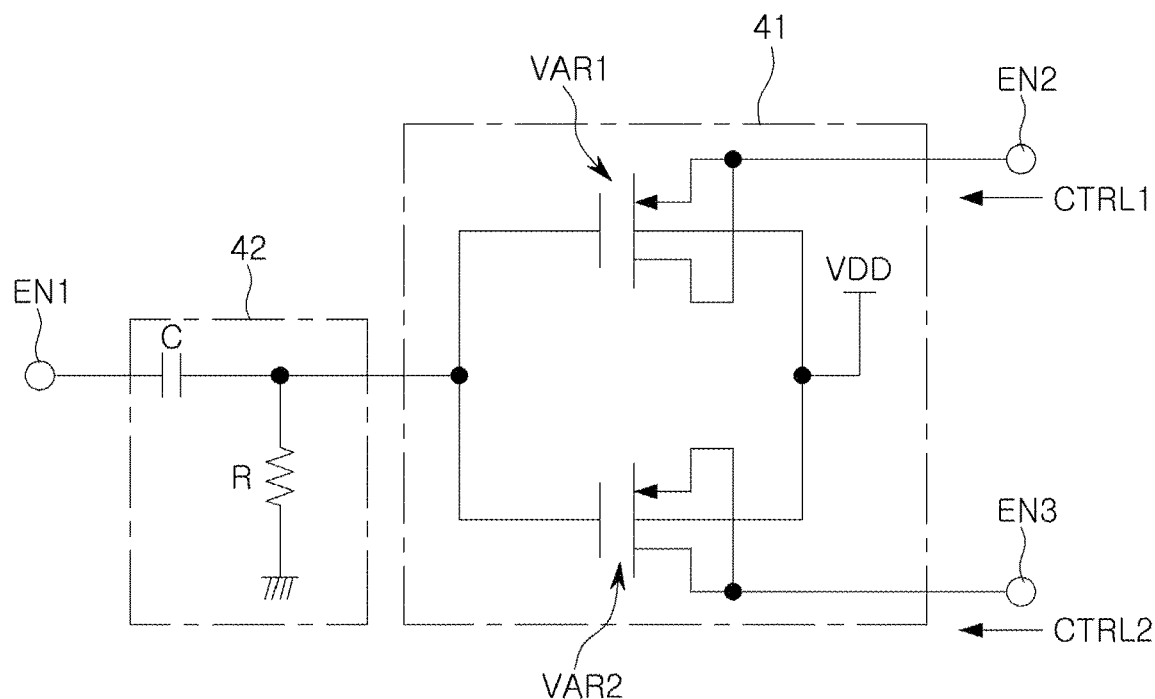
Figure 2C:
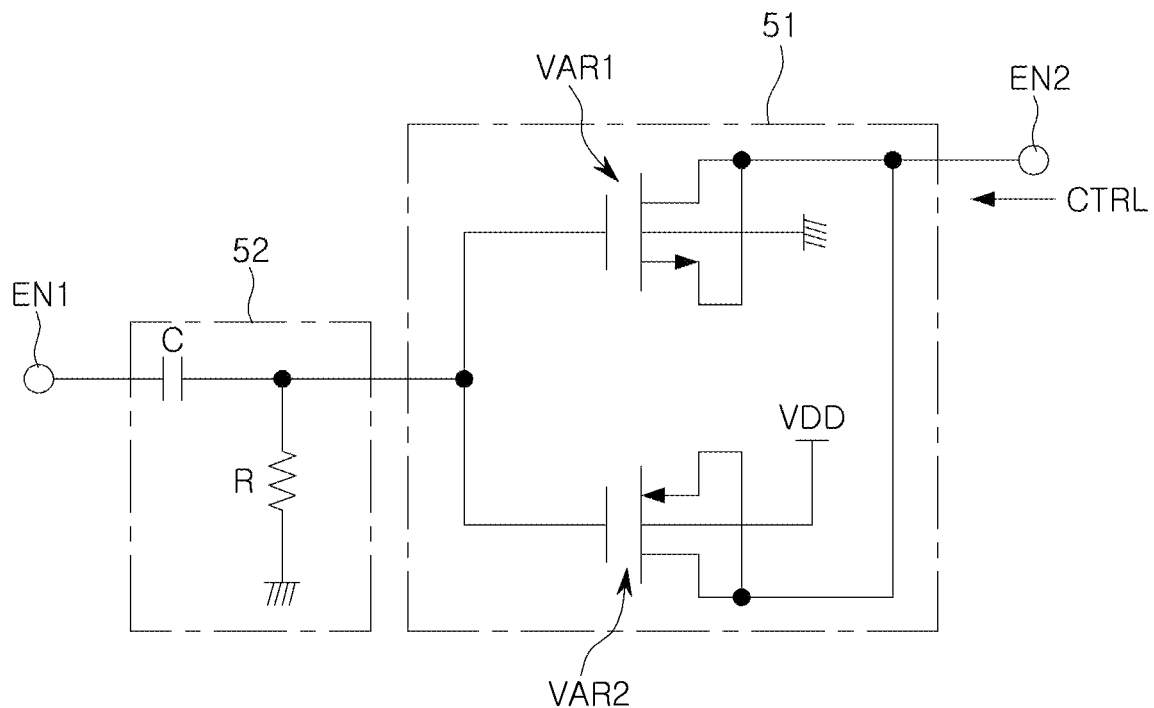

FIGS. 2A to 2C are circuit diagrams schematically illustrating a variable capacitor circuit according to an example embodiment.

Referring first to FIG. 2A, a variable capacitor circuit 30 may include a capacitor block 31 and an RC circuit 32, the RC circuit 32 may be connected to a first external node EN1, and the capacitor block 31 may be connected to a second external node EN2 and a third external node EN3. A first control signal CTRL1 may be input to the second external node EN2, and a second control signal CTRL2 may be input to the third external node EN3. In an example embodiment, the second control signal CTRL2 may be a complementary signal of the first control signal CTRL1.

A capacitor block 31 may include a first varactor element VAR1 including a first transistor and a second varactor element VAR2 including a second transistor. In the example embodiment illustrated in FIG. 2A, each of the first transistor and the second transistor may be an NMOS transistor. Since the first transistor is implemented as an NMOS, when the first control signal CTRL1 has a high voltage level corresponding to a high logic value, the first varactor element VAR1 operates in a depletion mode, and the first control signal CTRL1 is configured to operate the first varactor element VAR1 in a depletion mode. When the signal CTRL1 has a low voltage level corresponding to a low logic value, the first varactor element VAR1 may operate in an accumulation mode. The operation of the second varactor element VAR2 in response to the second control signal CTRL2 may be similar to the operation of the first varactor element VAR1.

Since the first transistor and the second transistor have different sizes, the capacitance that the first varactor element VAR1 has in the depletion mode and the accumulation mode, respectively, may be different from the capacitance that the second varactor element VAR2 has in the depletion mode and the accumulation mode, respectively. For example, the first transistor may be larger than the second transistor. In this case, the capacitance of the first varactor element VAR1 in the accumulation mode may be greater than the capacitance of the second varactor element VAR2 in the accumulation mode. Therefore, when the first varactor element VAR1 is in the accumulation mode, the second varactor element VAR2 is set to the depletion mode, and when the first varactor element VAR1 is in the depletion mode, the second varactor element VAR2 may be set to the accumulation mode, the adjustable capacitance difference in the variable capacitor circuit 30 may be reduced. As a result, the variable capacitor circuit 30 capable of finely adjusting the capacitance may be implemented, and the capacitance resolution of the variable capacitor circuit 30 may be improved.

A variable capacitor circuit 40 according to an example embodiment illustrated in FIG. 2B includes a capacitor block 41 and an RC circuit 42, and may have a configuration similar to that of the variable capacitor circuit 30 described with reference to FIG. 2A. However, in the example embodiment illustrated in FIG. 2B, first and second transistors providing a first varactor element VAR1 and a second varactor element VAR2 may be PMOS transistors. For example, when a first control signal CTRL1 has a high voltage level corresponding to a high logic value, the first varactor element VAR1 operates in the accumulation mode, and when the first control signal CTRL1 has a low voltage level corresponding to a low logic value, the first varactor element VAR1 may operate in a depletion mode. The operation of the second varactor element VAR2 in response to the second control signal CTRL2 may be similar to the operation of the first varactor element VAR1.

Next, referring to FIG. 2C, a variable capacitor circuit 50 may include a capacitor block 51 and an RC circuit 52, and may have a configuration similar to the configuration of the variable capacitor circuits 30 and 40 described with reference to FIGS. 2A and 2B. However, in the example embodiment illustrated in FIG. 2C, a first transistor providing a first varactor element VAR1 may be an NMOS transistor, and a second transistor providing a second varactor element VAR2 may be a PMOS transistor.

The source and drain of the first transistor and the source and drain of the second transistor may be commonly connected to a second external node EN2. When a control signal CTRL has a low voltage level corresponding to a low logic value, the first varactor element VAR1 may operate in an accumulation mode and the second varactor element VAR2 may operate in a depletion mode. On the other hand, when the control signal CTRL has a high voltage level corresponding to a high logic value, the first varactor element VAR1 may operate in a depletion mode and the second varactor element VAR2 may operate in an accumulation mode.

Figure 3A:
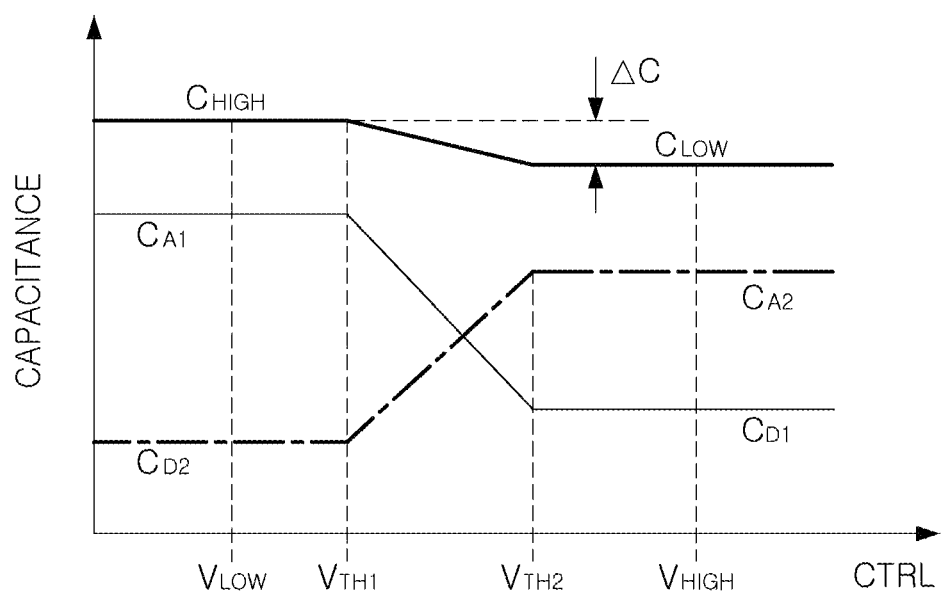
FIGS. 3A, 3B, and 3C are diagrams illustrating an operation of a variable capacitor circuit according to an example embodiment.
Figure 3B:
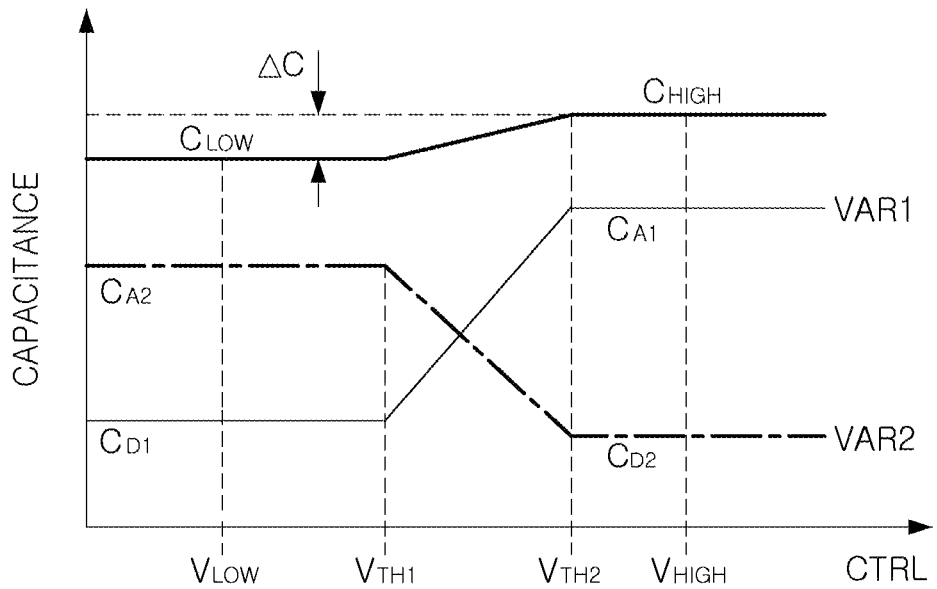
Figure 3C:
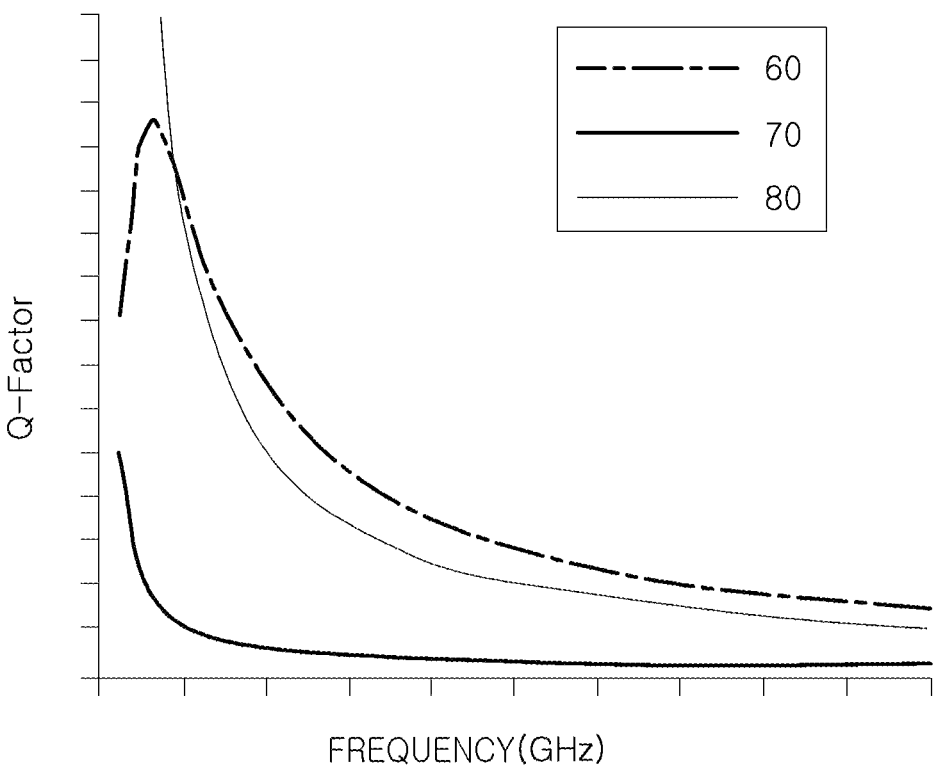

FIGS. 3A to 3C are diagrams illustrating an operation of a variable capacitor circuit according to an example embodiment.

FIG. 3A is a graph illustrating the operation of the variable capacitor circuit 30 described above with reference to FIG. 2A. Referring to FIG. 3A, an operating mode of each of the first varactor element VAR1 and the second varactor element VAR2 may be determined by a first control signal CTRL1 and the second control signal CTRL2. The first control signal CTRL1 may be a signal input to the source and drain of the first transistor providing the first varactor element VAR1 through a second external node EN2. In the example embodiment described with reference to FIG. 3A, a second control signal CTRL2 input to the source and drain of the second transistor providing the second varactor element VAR2 through a third external node EN3 may be a complementary signal of the first control signal CTRL1.

The voltage level of the first control signal CTRL1 may be determined as one of a low voltage level $V_{LOW}$ and a high voltage level $V_{HIGH}$. The second control signal CTRL2 may have a high voltage level $V_{HIGH}$ when the first control signal CTRL1 has a low voltage level $V_{LOW}$, and may have a low voltage level $V_{LOW}$ when the first control signal CTRL1 has a high voltage level $V_{HIGH}$.

The low voltage level $V_{LOW}$ and the high voltage level $V_{HIGH}$ may be determined by a first threshold voltage $V_{TH1}$ and a second threshold voltage $V_{TH2}$ at which the first varactor element VAR1 and the second varactor element VAR2 operate in a linear range. The low voltage level $V_{LOW}$ may be lower than the first threshold voltage $V_{TH1}$, and the high voltage level $V_{HIGH}$ may be higher than the second threshold voltage $V_{TH2}$.

When the first control signal CTRL1 has a low voltage level $V_{LOW}$ corresponding to a low logic value, a voltage less than the first threshold voltage $V_{TH1}$ is input to the source and drain of the first transistor, and a voltage greater than the second threshold voltage $V_{TH2}$ may be input to the source and drain of the second transistor. On the other hand, when the first control signal CTRL1 has a high voltage level $V_{HIGH}$ corresponding to a high logic value, a voltage greater than the second threshold voltage $V_{TH2}$ is input to the source and drain of the first transistor, and a voltage less than the first threshold voltage $V_{TH1}$ may be input to the source and drain of the second transistor.

When the first control signal CTRL1 has the low voltage level $V_{LOW}$, the first varactor element VAR1 may operate in an accumulation mode and the second varactor element VAR2 may operate in a depletion mode. Accordingly, capacitance $C_{HIGH}$ provided by the capacitor block 31 may be determined as a sum of a first accumulation capacitance $C_{A1}$ of the first varactor element VAR1 and a second depletion capacitance $C_{D2}$ of the second varactor element VAR2. On the other hand, when the first control signal CTRL1 has the high voltage level $V_{HIGH}$, the first varactor element VAR1 may operate in a depletion mode and the second varactor element VAR2 may operate in an accumulation mode. Accordingly, capacitance $C_{LOW}$ provided by the capacitor block 31 may be determined as a first depletion capacitance $C_{D1}$ of the first varactor element VAR1 and a second accumulation capacitance $C_{A2}$ of the second varactor element VAR2.

In the example embodiment illustrated in FIG. 3A, the first transistor may be larger than the second transistor. Accordingly, the first accumulation capacitance $C_{A1}$ may be greater than the second accumulation capacitance $C_{A2}$, and the first depletion capacitance $C_{D1}$ may be less than the second depletion capacitance $C_{D2}$. The capacitance difference $\Delta C$ adjustable by the capacitor block 31 may be determined as in Equation 1 below.

$$\Delta C = C_{HIGH} - C_{LOW} = (C_{A1} + C_{D2}) - (C_{A2} + C_{D1}) \quad \text{[Equation 1]}$$

As a result, the capacitance difference $\Delta C$ adjustable by the capacitor block 31 may decrease as the size difference between the first transistor and the second transistor decreases. Accordingly, the capacitance difference $\Delta C$ that may be adjusted in the capacitor block 31 may be determined using the difference in size between the first transistor and the second transistor, for example, using the difference in channel length and channel width, or the like, and the capacitor block 31 and the variable capacitor circuit 30 capable of finely adjusting the capacitance may be implemented.

FIG. 3B is a graph illustrating the operation of the variable capacitor circuit 40 described with reference to FIG. 2B above. Referring to FIG. 3B, an operating mode of each of the first varactor element VAR1 and the second varactor element VAR2 may be determined by the first control signal CTRL1 input through the second external node EN2 and the second control signal CTRL2 input through the third external node EN3. The second control signal CTRL2 may be a complementary signal of the first control signal CTRL1.

Since the first transistor and the second transistor are PMOS transistors, in the example embodiment described with reference to FIG. 3B, the operating mode of the first varactor element VAR1 and the second varactor element VAR2 according to the control signal CTRL may be determined differently from the example embodiment described with reference to FIG. 3A. For example, when the first control signal CTRL1 has a low voltage level $V_{LOW}$, the first varactor element VAR1 may operate in a depletion mode and the second varactor element VAR2 may operate in an accumulation mode. On the other hand, when the first control signal CTRL1 has the high voltage level $V_{HIGH}$, the first varactor element VAR1 may operate in the accumulation mode and the second varactor element VAR2 may operate in the depletion mode.

Other operations may be similar to the example embodiment described above with reference to FIG. 3A. For example, the capacitance difference ΔC adjustable by the capacitor block 41 may be determined as illustrated in Equation 1, and as the size difference between the first transistor and the second transistor decreases, the capacitance difference ΔC decreases and the capacitance resolution of the capacitor block 41 may be increased.

FIG. 3C is a graph illustrating a Q-factor according to a frequency band for each of the variable capacitor circuits 30 and 40 according to an example embodiment. A first graph or line 60 illustrates a Q-factor measured from the variable capacitor circuits 30 and 40 in which a pair of varactor elements VAR1 and VAR2 are connected in parallel to the RC circuits 32 and 42 as in the embodiments illustrated in FIGS. 2A and 2B. A second graph or line 70 illustrates a Q-factor measured from the variable capacitor circuit implemented only with a pair of varactor elements VAR1 and VAR2, without the RC circuits 32 and 42. A third graph or line 80 illustrates a Q-factor measured from a variable capacitor circuit implemented by digitally operating one varactor element.

Referring to FIG. 3C, it can be seen that as the frequency increases, Q-factors of the variable capacitor circuits 30 and 40 including the RC circuits 32 and 42 and a pair of varactor elements VAR1 and VAR2 have values higher than those of other comparative examples. For example, since 5G communication uses a frequency of 30 GHz band, the performance of the system may be improved by applying the variable capacitor circuits 30 and 40 according to an example embodiment to a system for 5G communication.

Figure 4A:
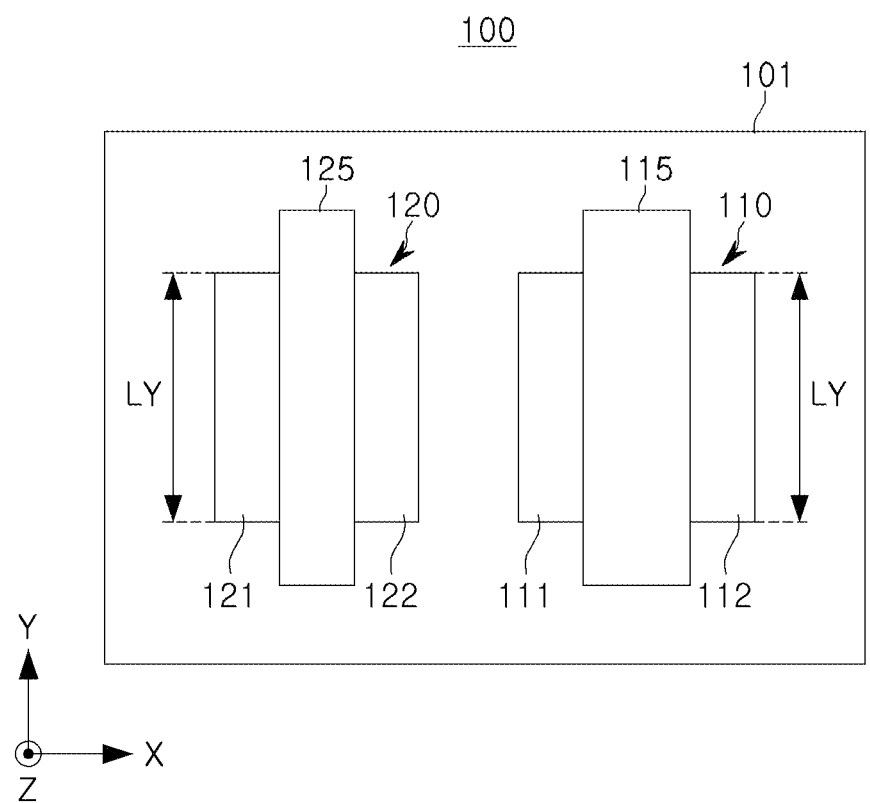
FIGS. 4A and 4B are diagrams schematically illustrating varactor elements of a variable capacitor circuit according to an example embodiment.
Figure 4B:
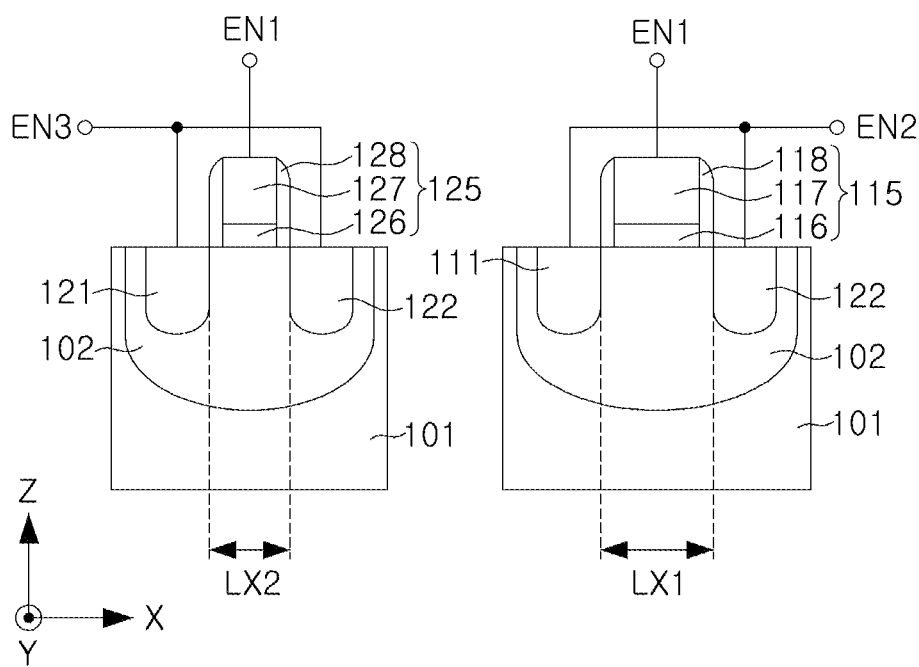

FIGS. 4A and 4B are diagrams schematically illustrating varactor elements of a variable capacitor circuit according to an example embodiment.

Referring to FIGS. 4A and 4B, a variable capacitor circuit according to an example embodiment may include a first transistor 110 included in a capacitor block 100 and providing a first varactor element, and a second transistor 120 providing a second varactor element. Each of the first transistor 110 and the second transistor 120 may be an NMOS transistor or a PMOS transistor.

The first transistor 110 may include a first source region 111, a first drain region 112, and a first gate structure 115, and the second transistor 120 may include a second source region 121, a second drain region 122 and a second gate structure 125. The source regions 111 and 121 and the drain regions 112 and 122 may be formed in a well region 102 formed in a substrate 101. The well region 102 may be a region doped with impurities of a specific conductivity type.

The first gate structure 115 may include a gate insulating layer 116, a gate electrode layer 117, and a gate spacer 118. The second gate structure 125 may also include a gate insulating layer 126, a gate electrode layer 127, and a gate spacer 128.

The first transistor 110 and the second transistor 120 may have different sizes. Referring to FIGS. 4A and 4B, a channel width LY of the first transistor 110 is equal to a channel width LY of the second transistor 120, while a channel length LX1 of the first transistor 110 may be different from a channel length LX2 of the second transistor 120. When the first transistor 110 and the second transistor 120 are formed as illustrated in FIGS. 4A and 4B, the capacitance of the first transistor 110 may be greater than the capacitance of the second transistor 120 in the accumulation mode. Also, in the depletion mode, the capacitance of the first transistor 110 may be less than the capacitance of the second transistor 120.

Referring to FIG. 4B, the first gate structure 115 and the second gate structure 125 may be commonly connected to one first external node EN1. On the other hand, the first source region 111 and the second drain region 112 may be connected to the second external node EN2, and the second source region 121 and the second drain region 122 may be connected to the third external node EN3. In an example embodiment, signals having a complementary relationship to each other may be input to the second external node EN2 and the third external node EN3. For example, the second source region 121 and the second drain region 122 may be connected to the second external node EN2 through an inverter, and in this case, a control signal input through the second external node EN2 may be input to the first source region 111 and the second drain region 112, and a complementary signal of the control signal may be input to the second source region 121 and the second drain region 122.

Figure 5:
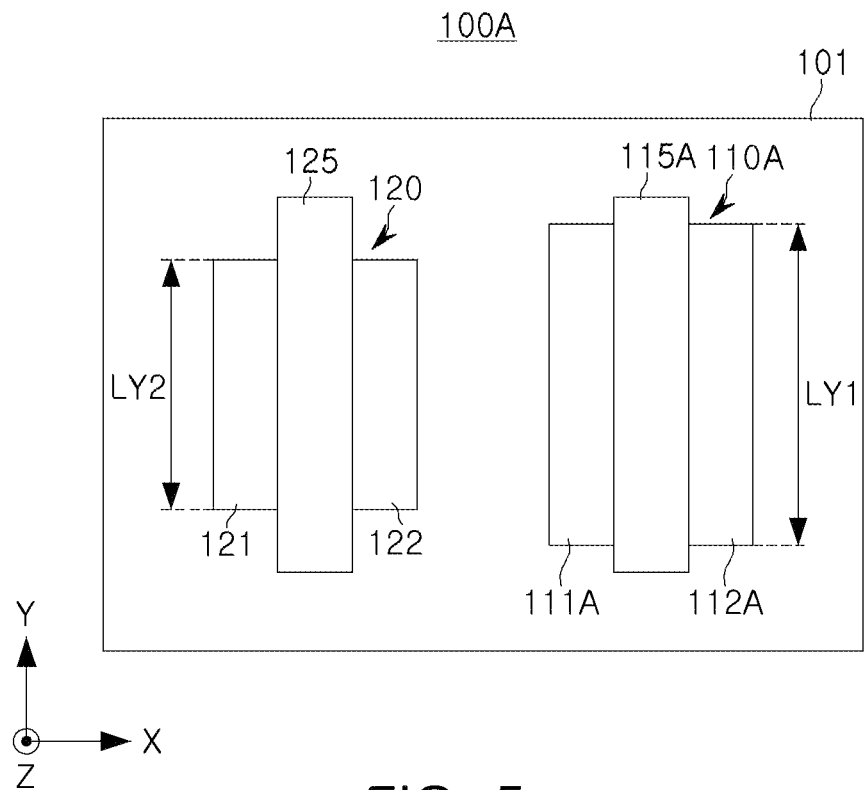
FIGS. 5 and 6 are diagrams schematically illustrating varactor elements of a variable capacitor circuit according to an example embodiment.
Figure 6:
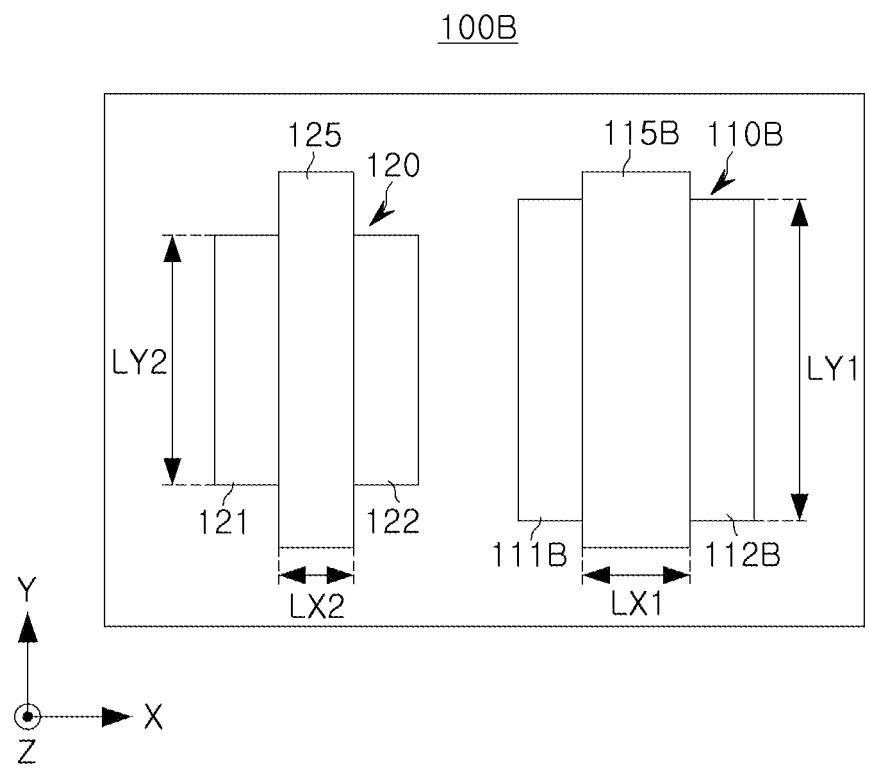

FIGS. 5 and 6 are diagrams schematically illustrating varactor elements of a variable capacitor circuit according to example embodiments.

Referring first to FIG. 5, a capacitor block 100A may include a first transistor 110A providing a first varactor element and a second transistor 120 providing a second varactor element. The configurations of the first transistor 110A and the second transistor 120 may be similar to the example embodiment described above with reference to FIGS. 4A and 4B.

However, in the example embodiment illustrated in FIG. 5, a channel width LY1 of the first transistor 110A may be greater than a channel width LY2 of the second transistor 120, and channel lengths thereof may be the same as each other. Since the channel width LY1 of the first transistor 110A is relatively greater than the channel width LY2 of the second transistor 120, the difference in capacitance appearing in or provided by the first varactor element according to the operating mode may be greater than the difference in capacitance appearing in or provided by the second varactor element according to the operating mode.

Next, referring to FIG. 6, a capacitor block 100B may include a first transistor 110B and a second transistor 120. In the example embodiment of FIG. 6, a channel width LY1 of the first transistor 110B may be greater than a channel width LY2 of the second transistor 120, and a channel length LX1 of the first transistor 110B may be greater than a channel length LX2 of the second transistor 120. Accordingly, in the example embodiment illustrated in FIG. 6, the difference in the adjustable capacitance in the capacitor block 100B may be greater than in the example embodiments described with reference to FIGS. 4A, 4B and 5.

Figure 7A:
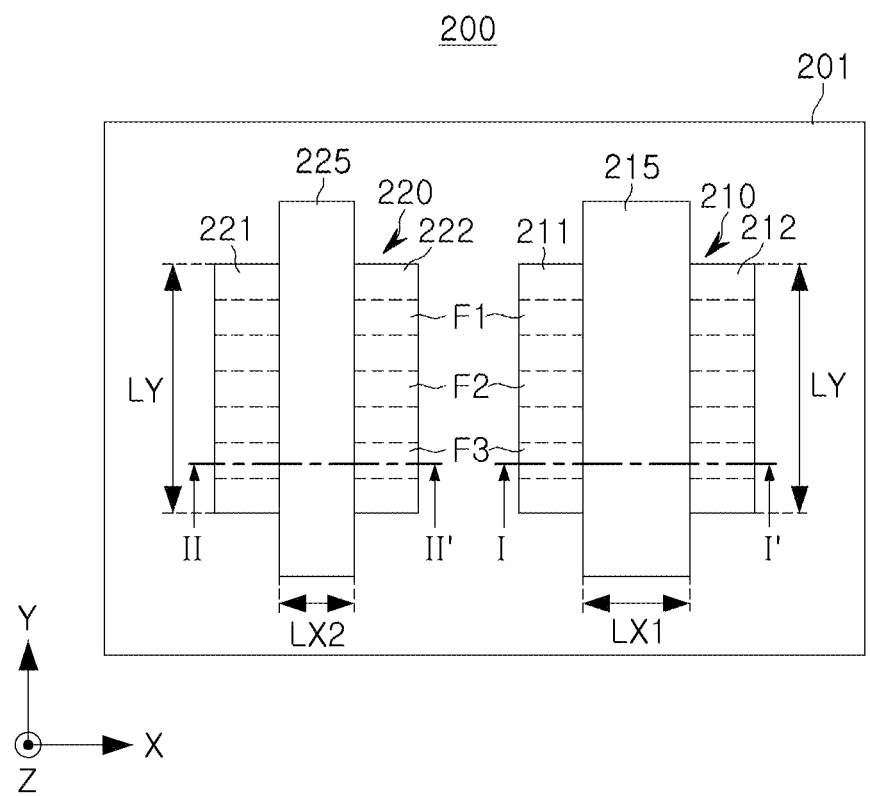
FIGS. 7A and 7B are diagrams schematically illustrating varactor elements of a variable capacitor circuit according to an example embodiment.
Figure 7B:
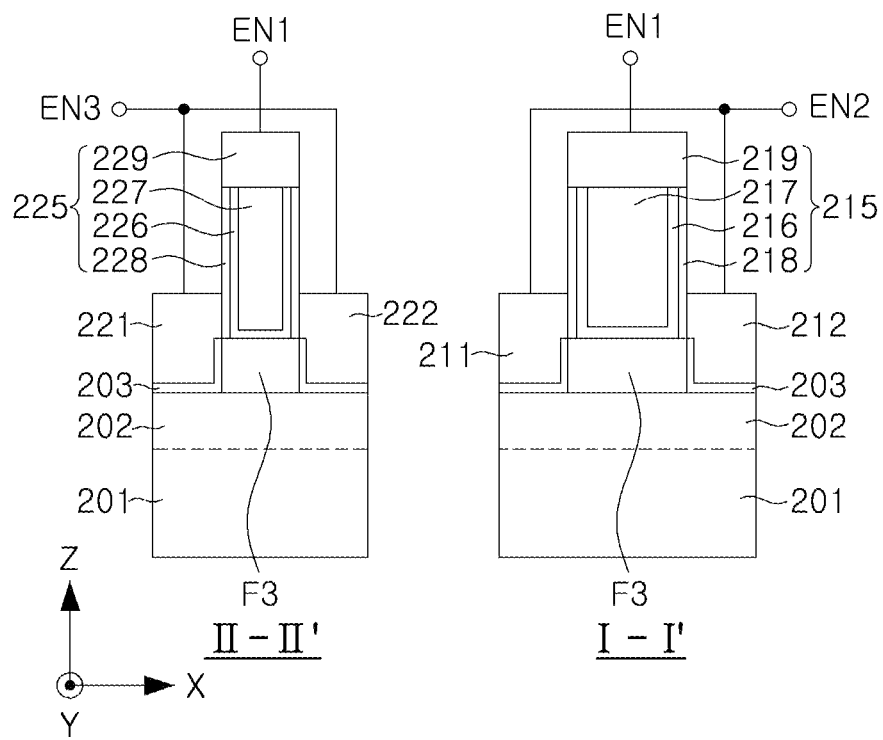

FIGS. 7A and 7B are diagrams schematically illustrating varactor elements of a variable capacitor circuit according to an example embodiment.

Referring to FIG. 7A and FIG. 7B (which illustrates cross-sections taken along lines I-I' and II-II' of FIG. 7A), a variable capacitor circuit according to an example embodiment may include a first transistor 210 and providing a first varactor element, and a second transistor 220 providing a second varactor element, included in a capacitor block 200. Each of the first transistor 210 and the second transistor 220 may be an NMOS transistor or a PMOS transistor, and may include fin structures F1, F2, F3 providing a channel.

The first transistor 210 may include a first source region 211, a second drain region 212, and a first gate structure 215, and the second transistor 220 may include a second source region 221, a second drain region 222 and a second gate structure 225. The source regions 211 and 221 and the drain regions 212 and 222 may be connected to the fin structures F1 to F3 and may be electrically connected to active regions 202 and 203 formed in a substrate 201.

The active regions 202 and 203 may include a lower active region 202, and an upper active region 203 connected to the fin structures F1 to F3. For example, the source regions 211 and 221 and the drain regions 212 and 222 may be formed by a selective epitaxial growth (SEG) process performed using the upper active region 203.

The first gate structure 215 may include a gate insulating layer 216, a gate electrode layer 217, a gate spacer 218, and a capping layer 219. The second gate structure 225 may also include a gate insulating layer 226, a gate electrode layer 227, a gate spacer 228, and a capping layer 229.

The first transistor 210 and the second transistor 220 may have different sizes. As illustrated in FIGS. 7A and 7B, the first transistor 210 and the second transistor 220 may have the same channel width LY, but different channel lengths. For example, a channel length LX1 of the first transistor 210 may be greater than a channel length LX2 of the second transistor 220. Accordingly, in the accumulation mode, the capacitance of the first transistor 210 may be greater than that of the second transistor 220, and in the depletion mode, the capacitance of the first transistor 210 may be less than the capacitance of the second transistor 220.

Figure 8A:
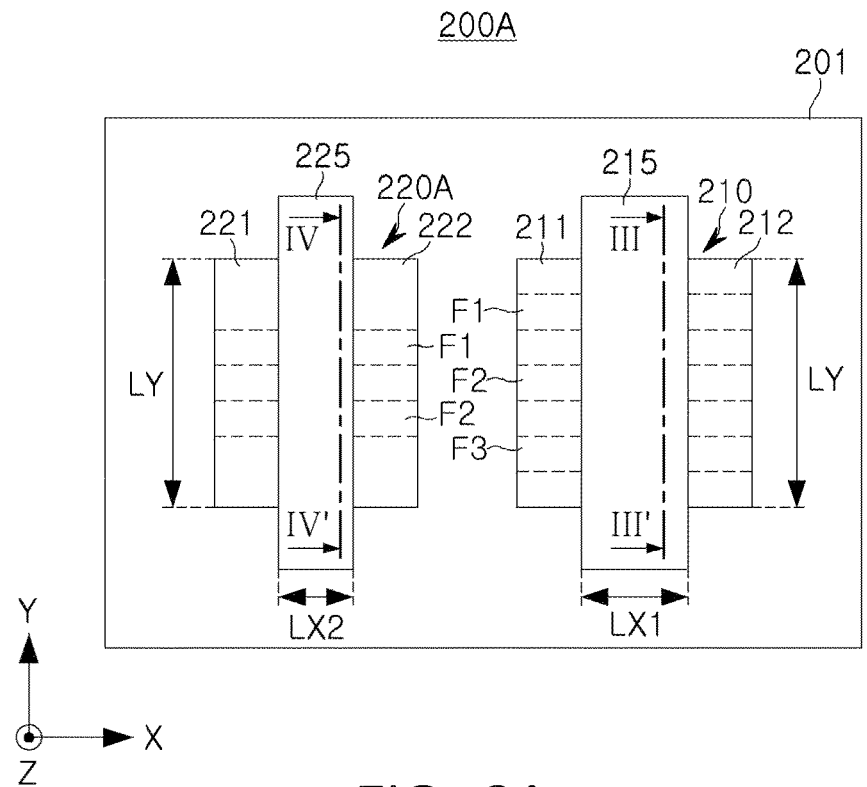
FIGS. 8A and 8B are diagrams schematically illustrating varactor elements of a variable capacitor circuit according to an example embodiment.
Figure 8B:
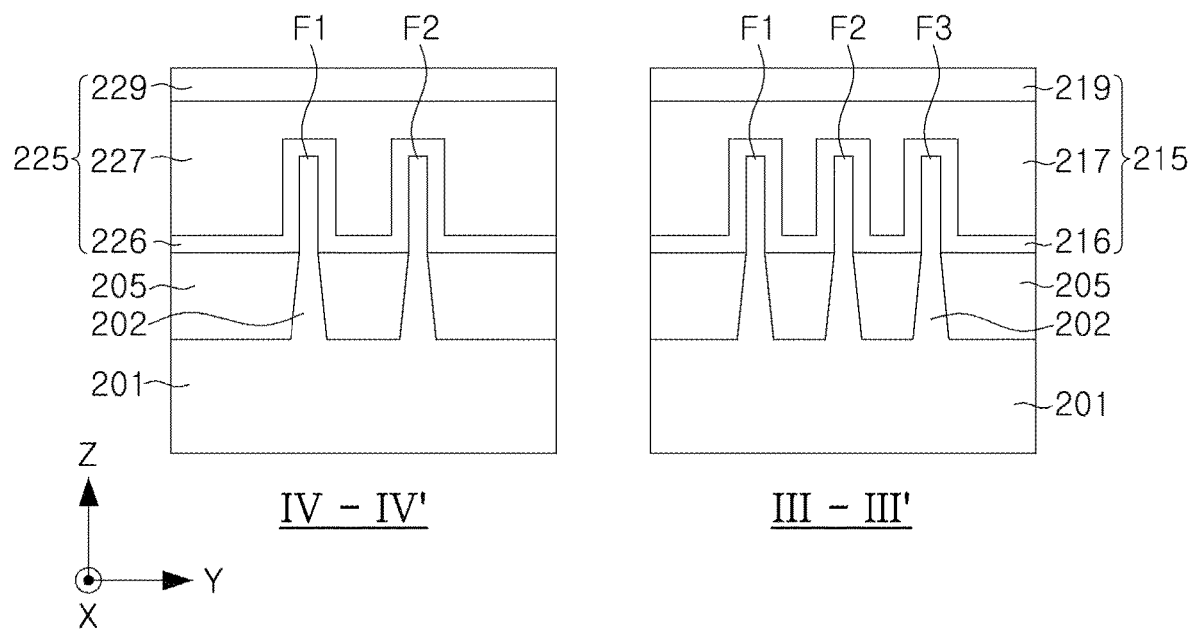

FIGS. 8A and 8B are diagrams schematically illustrating varactor elements of a variable capacitor circuit according to an example embodiment.

Referring to FIG. 8A and FIG. 8B (which illustrates cross-sections taken along lines and IV-IV' of FIG. 8A), a first transistor 210 and a second transistor 220A ma provide a first varactor element and a second varactor element included in a capacitor block 200A. Each of the first transistor 210 and the second transistor 220A may include fin structures providing a channel. Referring to FIGS. 8A and 8B, the number of fin structures F1, F2, F3 included in the first transistor 210 may be greater than the number of fin structures F1, F2 included in the second transistor 220A.

Accordingly, in the accumulation mode, the capacitance of the first transistor 210 may be greater than that of the second transistor 220A, and in the depletion mode, the capacitance of the first transistor 210 may be less than the capacitance of the second transistor 220A. The difference between the capacitance of the first transistor 210 and the capacitance of the second transistor 220A may be greater than in the example embodiment described with reference to FIGS. 7A and 7B, in each of the operating modes. As a result, the adjustable capacitance difference in the capacitor block 200A may be greater than that in the example embodiment described with reference to FIGS. 7A and 7B.

Figure 9A:
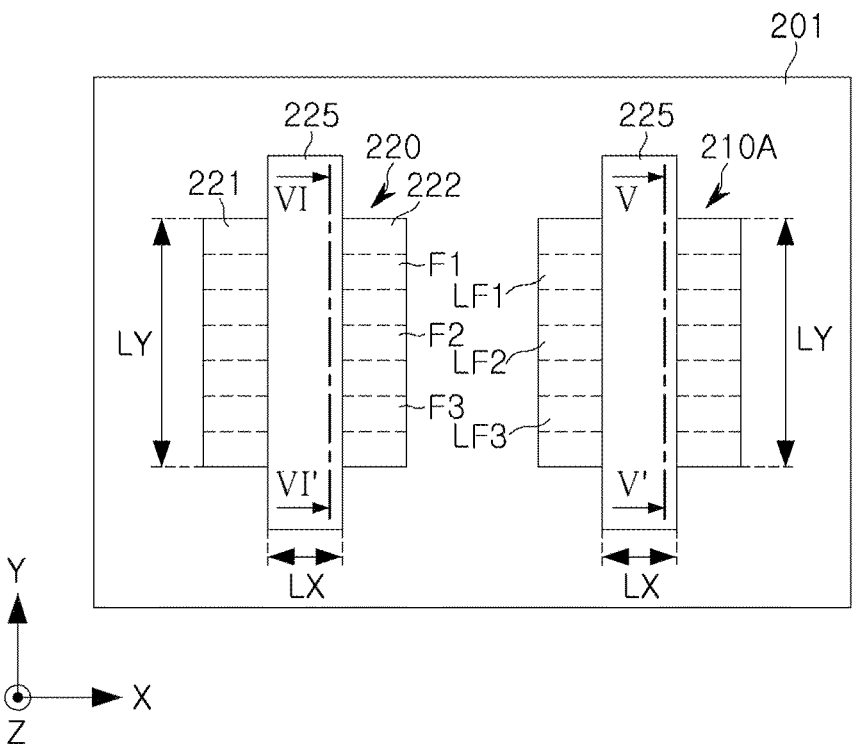
FIGS. 9A and 9B are diagrams schematically illustrating varactor elements of a variable capacitor circuit according to an example embodiment.
Figure 9B:
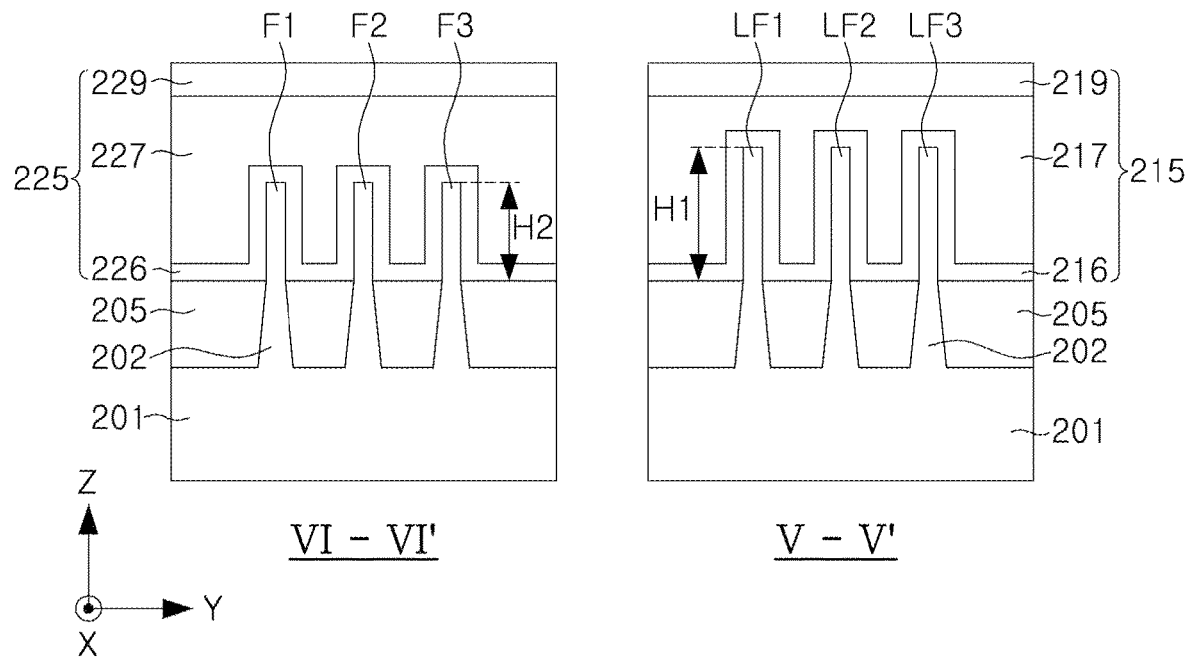

FIGS. 9A and 9B are diagrams schematically illustrating varactor elements of a variable capacitor circuit according to an example embodiment.

Referring to FIG. 9A and FIG. 9B (which illustrates cross-sections taken along lines V-V' and VI-VI' of FIG. 9A), a first transistor 210A and a second transistor 220 may provide a first varactor element and a second varactor element included in a capacitor block 200B. Each of the first transistor 210A and the second transistor 220 may include fin structures providing a channel. Referring to FIG. 8B, in a direction (Z-axis direction) perpendicular to an upper surface of the substrate 201, a length or height H1 of the fin structures LF1, LF2, LF3 included in the first transistor 210A may be greater than a length or height H2 of the fin structures F1, F2, F3 included in the second transistor 220.

Accordingly, the difference between the capacitance of the first transistor 210 and the capacitance of the second transistor 220A may be greater than in the example embodiment described with reference to FIGS. 7A and 7B, in each of the operating modes. As a result, the adjustable capacitance difference in the capacitor block 200B may be greater than that in the example embodiment described with reference to FIGS. 7A and 7B.

Figure 10:
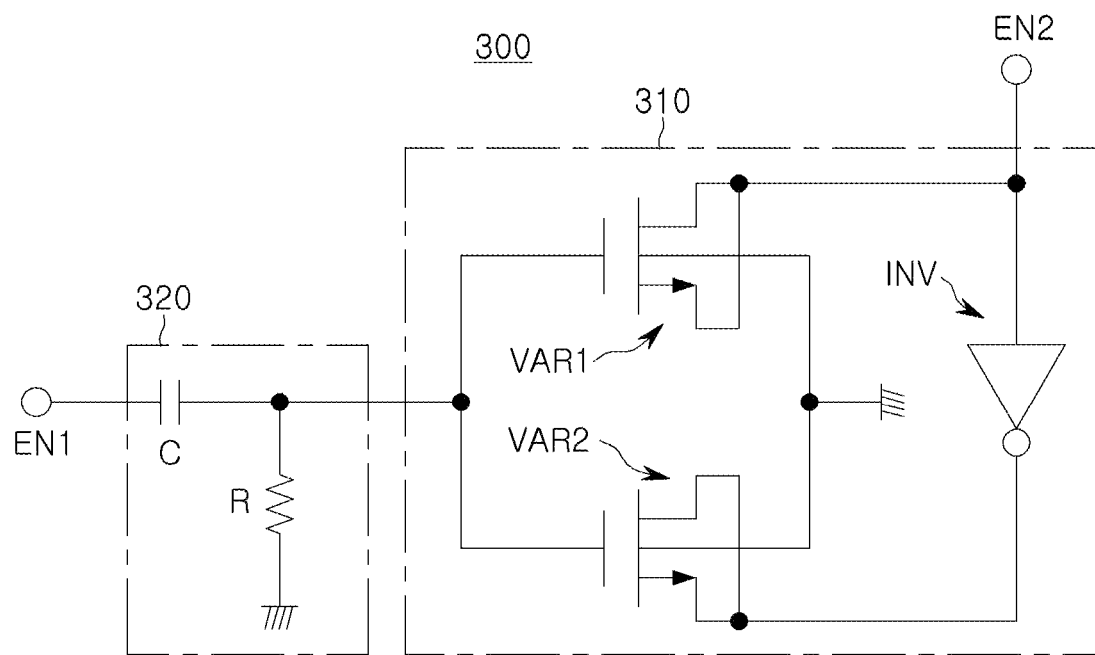
FIGS. 10, 11, and 12 are diagrams illustrating an operation of a variable capacitor circuit according to an example embodiment.
Figure 11:
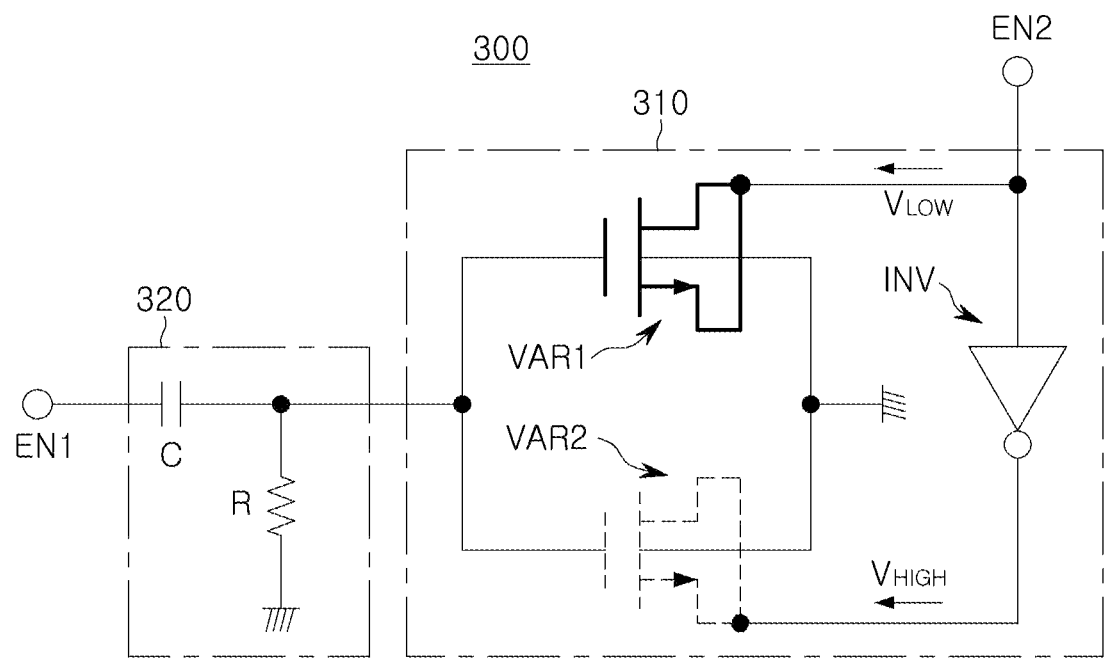
Figure 12:
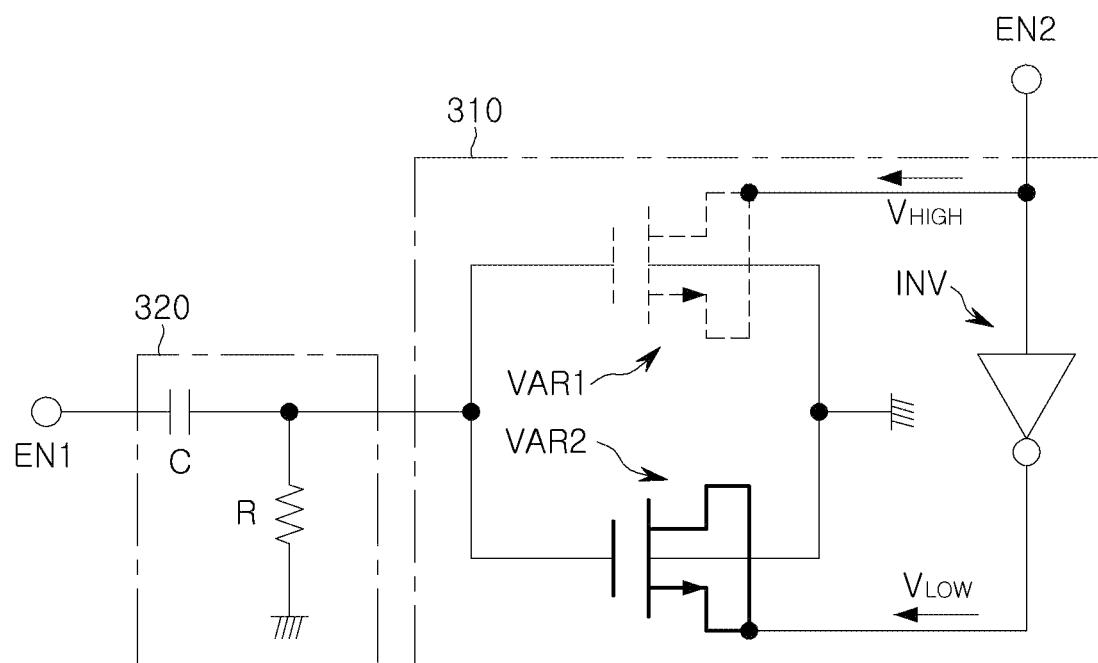

FIGS. 10 to 12 are diagrams illustrating an operation of a variable capacitor circuit according to an example embodiment.

First, referring to FIG. 10, a variable capacitor circuit 300 according to an example embodiment may include a capacitor block 310 and an RC circuit 320. The capacitor block 310 may include a first varactor element VAR1 and a second varactor element VAR2. Gates of the first varactor element VAR1 and the second varactor element VAR2 may be commonly connected to the RC circuit 320, and bodies thereof may be connected to a ground node or ground voltage. The source and drain of the first varactor element VAR1 may be connected to a second external node EN2, and the source and drain of the second varactor element VAR2 may be connected to the second external node EN2 through an inverter INV.

The inverter INV may receive a first control signal through the second external node EN2, and may output a second control signal by inverting the first control signal. Accordingly, a signal input to the source and drain of the first varactor element VAR1 and a signal input to the source and drain of the second varactor element VAR2 may have a complementary relationship with each other. Since the first varactor element VAR1 and the second varactor element VAR2 are connected to each other in parallel, the capacitance provided by the capacitor block 310 may be determined as a sum of the capacitance of the first varactor element VAR1 and the capacitance of the second varactor element VAR2.

Next, referring to FIG. 11, the first varactor element VAR may operate in an accumulation mode by a first control signal input through the second external node EN2 and having a low voltage level $V_{LOW}$ corresponding to a low logic value. On the other hand, the second varactor element VAR2 may operate in a depletion mode by the second control signal output by the inverter INV and having a high voltage level $V_{HIGH}$.

Referring to FIG. 12, the first varactor element VAR1 may operate in a depletion mode by a first control signal having a high voltage level $V_{HIGH}$ corresponding to a high logic value. The second varactor element VAR2 may operate in the accumulation mode by the second control signal output by the inverter INV and having the low logic value having the low voltage level $V_{LOW}$.

The first transistor providing the first varactor element VAR1 may have a size different from that of the second transistor providing the second varactor element VAR2. For example, when the first transistor is larger than the second transistor, the capacitance provided by the capacitor block 310 has a maximum value when the first varactor element VAR1 is in the accumulation mode, and has a minimum value when the second varactor element VAR2 is in the accumulation mode.

Figure 13A:
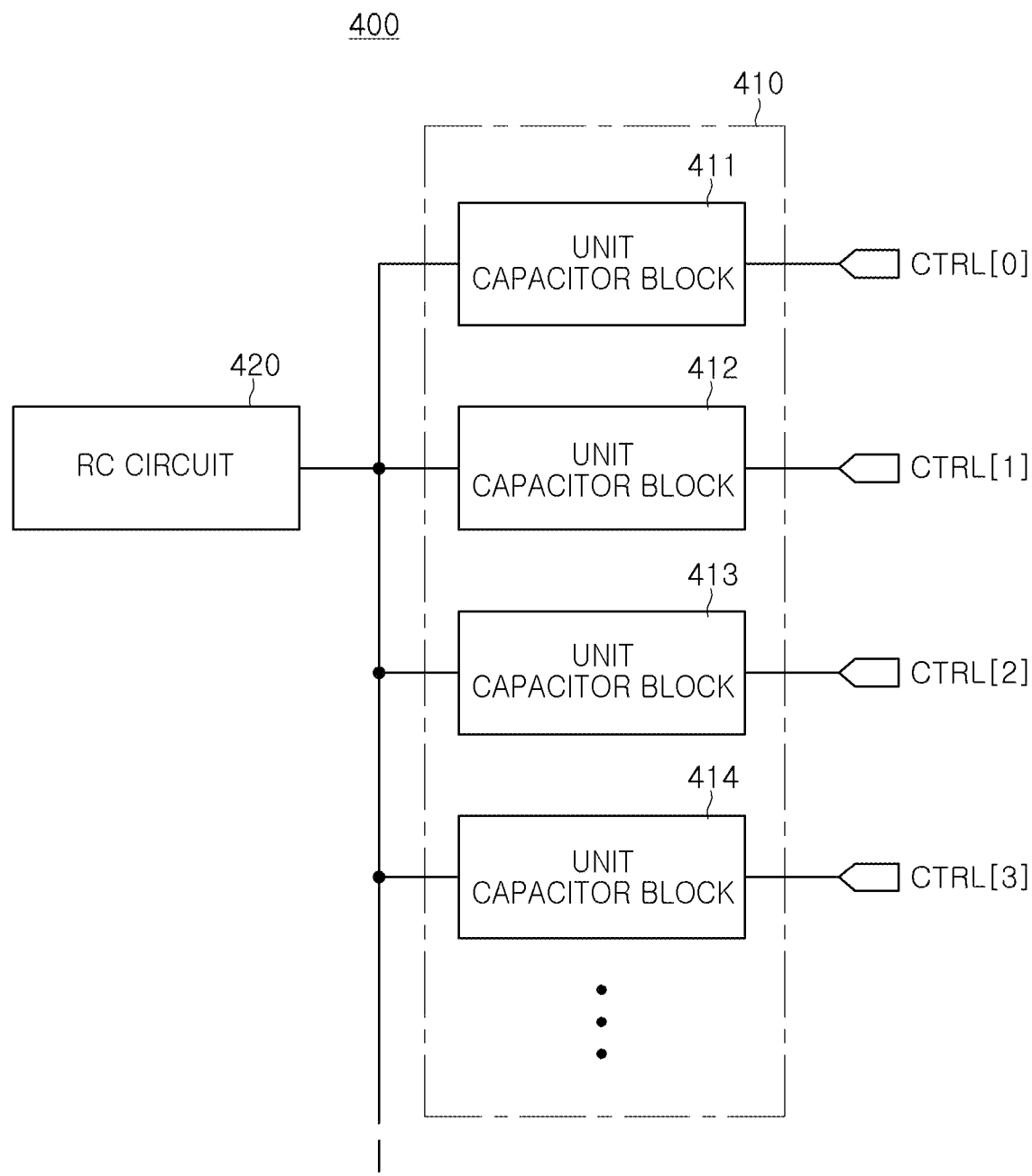
FIGS. 13A, 13B, and 14 are diagrams schematically illustrating a variable capacitor circuit according to an example embodiment.
Figure 13B:
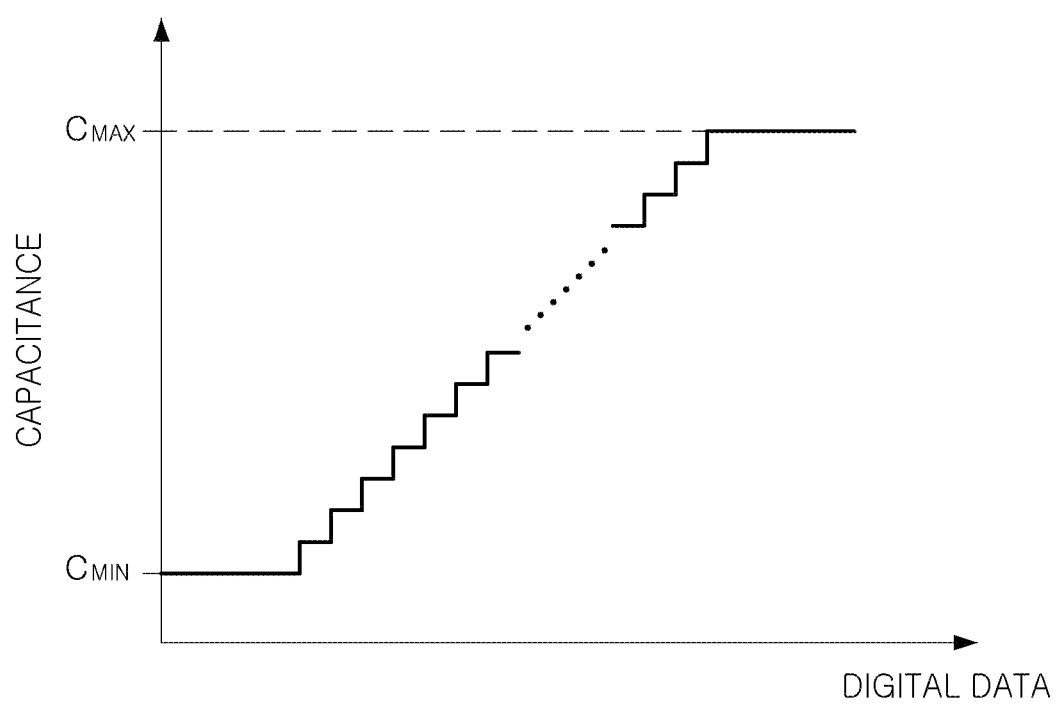
Figure 14:
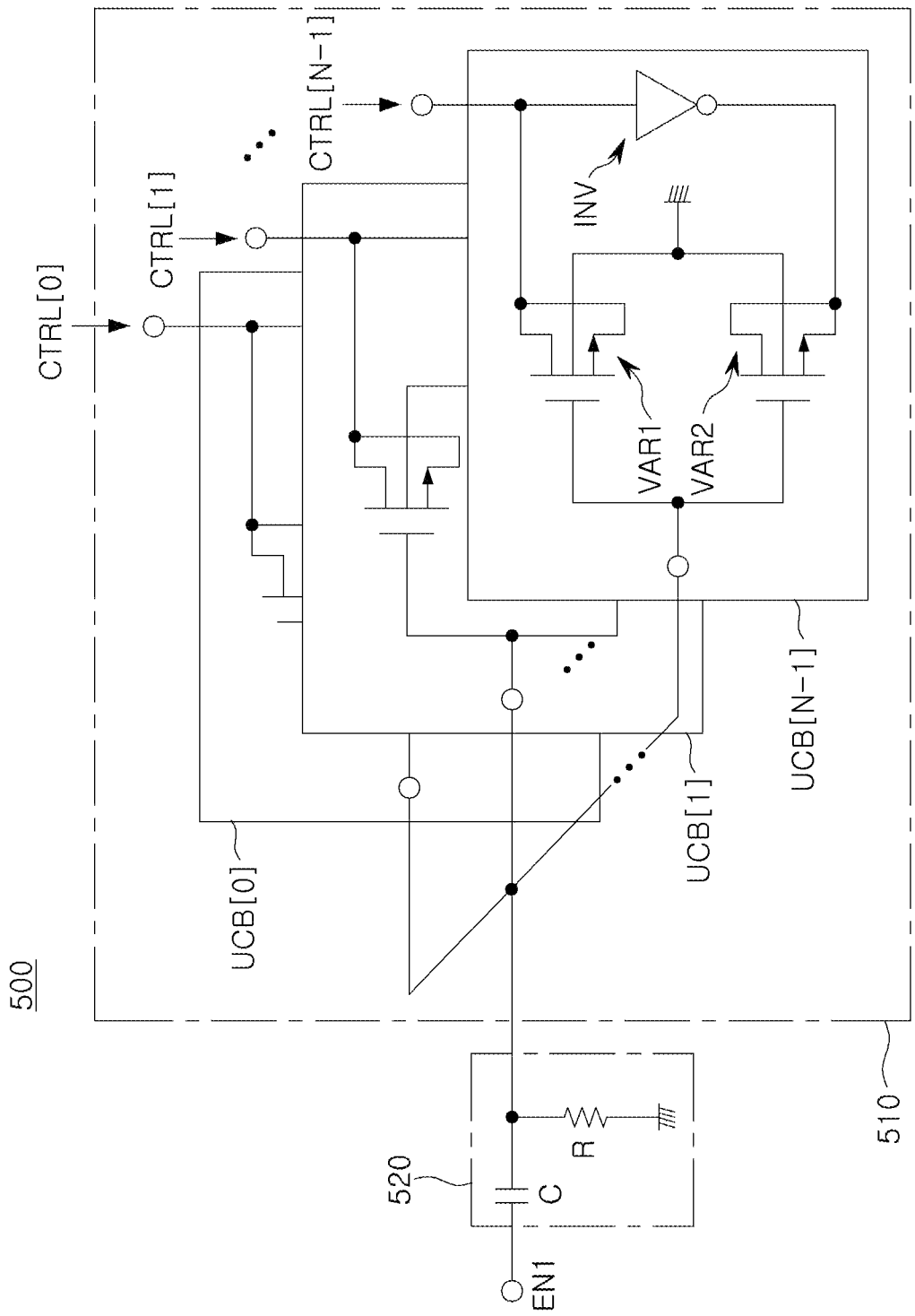

FIGS. 13A, 13B, and 14 are diagrams schematically illustrating a variable capacitor circuit according to example embodiments.

First, referring to FIG. 13A, a variable capacitor circuit 400 according to an example embodiment may include a capacitor circuit 410 that includes a plurality of unit capacitor blocks 411-414, and an RC circuit 420. The unit capacitor blocks 411-414 may be connected to each other in parallel and may be controlled by a control signal.

In an example embodiment, the control signal may have a voltage determined by N-bit digital data, and the number of bits of the digital data may be determined by the number of unit capacitor blocks 411-414 included in the variable capacitor circuit 400. For example, when the variable capacitor circuit 400 includes N unit capacitor blocks 411-414, N control signals input to the unit capacitor blocks 411-414 may be generated by N-bit digital data. For example, a control signal input to each of the unit capacitor blocks 411-414 may have a voltage determined to correspond to any one of N bits included in digital data.

A configuration of each of the unit capacitor blocks 411-414 may be similar to the above-described embodiments. For example, each of the unit capacitor blocks 411-414 may include a pair of varactor elements and one inverter. According to example embodiments, the pair of varactor elements may be implemented as NMOS transistors or PMOS transistors. Alternatively, in an example embodiment, one of the pair of varactor elements may be implemented as an NMOS transistor, and the other may be implemented as a PMOS transistor. In this case, each of the unit capacitor blocks 411-414 may not include an inverter.

The configuration of the unit capacitor blocks 411-414 may be determined by a difference between a maximum value and a minimum value of the capacitance to be controlled by the variable capacitor circuit 400, and/or the minimum unit of a difference in capacitance to be controlled by the variable capacitor circuit 400. For example, when the capacitance is adjusted in a very small unit (for example, atto farads) by the variable capacitor circuit 400, a size difference between a pair of transistors providing a pair of varactor elements in each of the unit capacitor blocks 411-414 may be formed to be significantly small. Also, when the difference between a maximum value and a minimum value of the capacitance that may be provided by the variable capacitor circuit 400 is relatively large, the number of unit capacitor blocks 411-414 included in the variable capacitor circuit 400 may increase.

Referring to FIG. 13B, by forming a pair of transistors providing a pair of varactor elements to have a significantly small difference in size therebetween in each of the unit capacitor blocks 411-414, the capacitance may be adjusted by a very small unit, resulting in the effect of increasing the capacitance resolution. On the other hand, the number of unit capacitor blocks 411-414 may be determined according to a minimum value $C_{MIN}$ and a maximum value $C_{MAX}$ of the capacitance to be provided to the variable capacitor circuit 400. By reducing the size difference between the pair of transistors included in each of the unit capacitor blocks 411-414 and increasing the number of the unit capacitor blocks 411-414, a variable capacitor circuit 400 having an effect similar to linearly adjusting the capacitance between the minimum value $C_{MIN}$ and the maximum value $C_{MAX}$ may be implemented.

Referring to FIG. 14, a variable capacitor circuit 500 may include a capacitor circuit 510 including a plurality of unit capacitor blocks UCB[0]-UCB[N−1], and an RC circuit 520. The RC circuit 520 may be connected to a first external node EN1. The number of unit capacitor blocks UCB[0]-UCB[N−1] is N (where N is a natural number equal to or greater than 2), and may be connected to each other in parallel.

Each of the unit capacitor blocks UCB[0]-UCB[N−1] includes first and second varactor elements VAR1 and VAR2 and an inverter INV, and the first and second varactor elements VAR1 and VAR2 may be connected to each other in parallel. Each of the first and second varactor elements VAR1 and VAR2 may be implemented as a transistor. In at least some of the unit capacitor blocks UCB[0]-UCB[N−1], the first and second varactor elements VAR1 and VAR2 may have different sizes. For example, a transistor providing the first varactor element VAR1 of the first unit capacitor block UCB[0] and a transistor providing the first varactor element VAR1 of the second unit capacitor block UCB[0] may have different sizes.

The capacitor circuit 510 receives control signals CTRL[0]-CTRL[N−1] corresponding to N-bit digital data, and the control signals CTRL[0]-CTRL[N−1] may be input to the unit capacitor blocks UCB[0]-UCB[N−1], respectively. For example, the first control signal CTRL[0] may be input to the first unit capacitor block UCB[0], and the N-th control signal CTRL[N−1]) may be input to the N-th unit capacitor block UCB[N−1].

The operation of each of the unit capacitor blocks UCB[0]-UCB[N−1] may be determined by the control signals CTRL[0]-CTRL[N−1]. For example, when the N-th bit of the digital data has a high logic value, the N-th control signal CTRL[N−1] may have a voltage corresponding to the high logic value, and the first varactor element VAR1 may operate in a depletion mode and the second varactor element VAR2 may operate in an accumulation mode, in the N-th unit capacitor block UCB[N−1]).

The total capacitance of the capacitor block 510 may be determined as the sum of capacitances provided by the unit capacitor blocks UCB[0]-UCB[N−1]. Accordingly, in the example embodiment illustrated in FIG. 14, the total capacitance of the capacitor block 510 may be determined by the control signals CTRL[0]-CTRL[N−1] corresponding to N-bit digital data. For example, a case in which the size of the first varactor element VAR1 is larger than that of the second varactor element VAR2 in each of the unit capacitor blocks UCB[0]-UCB[N−1] may be provided as an example. In this case, when all of N bits included in the digital data have a high logic value, the total capacitance of the capacitor block 510 may have a maximum value. On the other hand, when all of the N bits included in the digital data have a low logic value, the total capacitance of the capacitor block 510 may have a minimum value.

Although the example embodiment illustrated in FIG. 14 illustrates the case in which each of the first and second varactor elements VAR1 and VAR2 is implemented as an NMOS transistor, each of the first and second varactor elements VAR1 and VAR2 may also be implemented as a PMOS transistor. Alternatively, one of the first varactor element VAR1 and the second varactor element VAR2 may be implemented as an NMOS transistor, and the other may be implemented as a PMOS transistor. For example, when one of the first varactor element VAR1 and the second varactor element VAR2 is implemented as an NMOS transistor and the other is implemented as a PMOS transistor, an inverter may be omitted from each of the unit capacitor blocks UCB[0]-UCB[N−1].

FIGS. 15 to 19 are diagrams illustrating an operation of a variable capacitor circuit according to an example embodiment.

Figure 15:
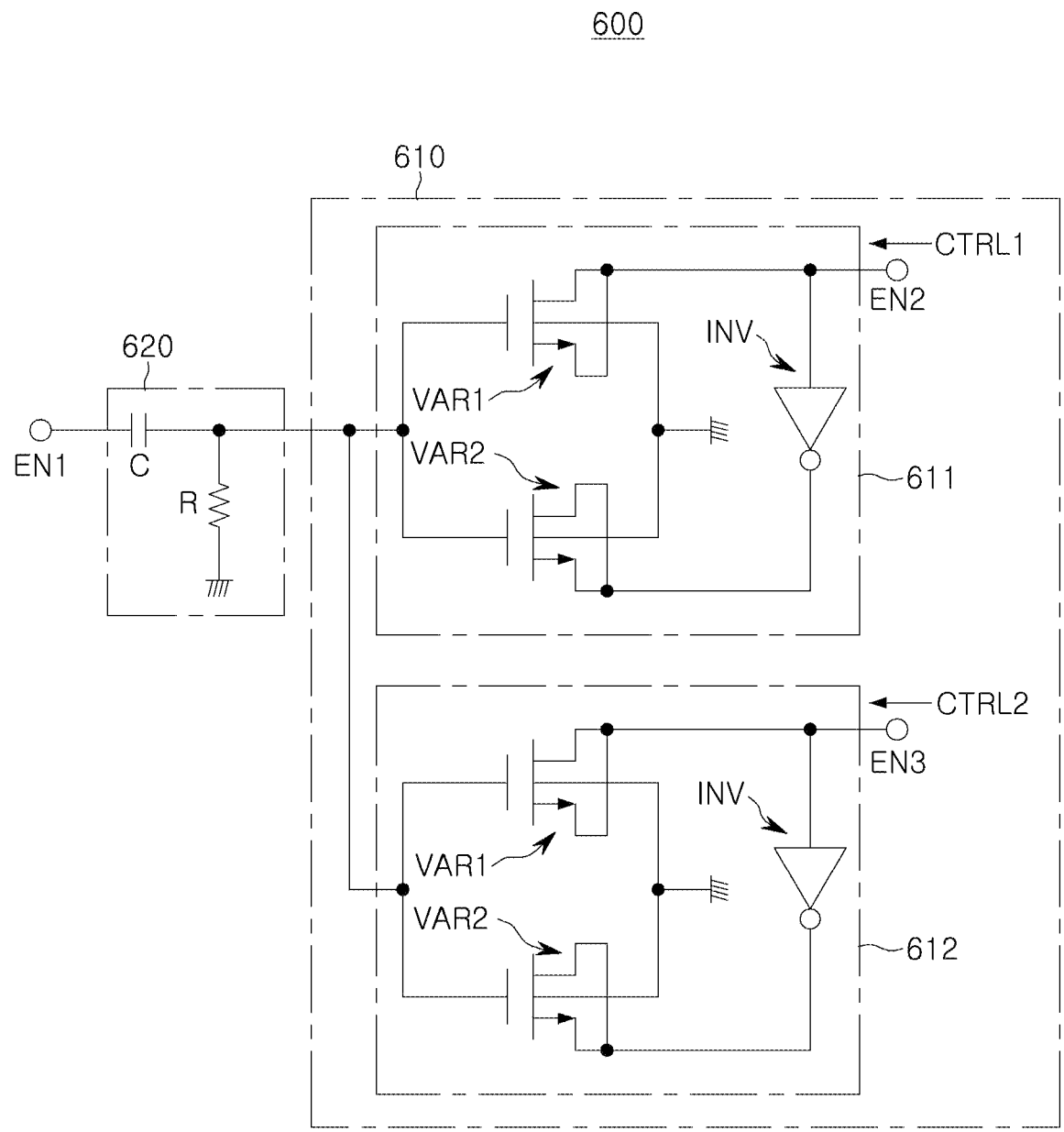
FIGS. 15, 16, 17, 18, and 19 are diagrams illustrating an operation of a variable capacitor circuit according to an example embodiment.

Referring first to FIG. 15, a variable capacitor circuit 600 according to an example embodiment may include a capacitor block 610 and an RC circuit 620. The RC circuit 620 may be connected between a first external node EN1 and the capacitor block 610, and the capacitor block 610 may include a first unit capacitor block 611 connected to a second external node EN2, and a second unit capacitor block 612 connected to a third external node EN3.

The first varactor element VAR1 and the second varactor element VAR2 included in the first unit capacitor block 611 may have different characteristics from the first varactor element VAR1 and the second varactor element VAR2 included in the second unit capacitor block 612. For example, a difference in size between the first transistor providing the first varactor element VAR1 and the second transistor providing the second varactor element VAR2, in the first unit capacitor block 611, may be different from a difference in size between the first transistor providing the first varactor element VAR1 and the second transistor providing the second varactor element VAR2 in the second unit capacitor block 612.

By configuring the capacitor block 610 in this manner, the capacitance difference that is adjustable in the first unit capacitor block 611 by the first control signal CTRL1 may be different from the capacitance difference that is adjustable in the second unit capacitor block 612 by the second control signal CTRL2. The capacitance difference adjustable in each of the first unit capacitor block 611 and the second unit capacitor block 612 may increase as the size difference between the first transistor and the second transistor increases.

Hereinafter, the operation of the variable capacitor circuit 600 will be described in more detail with reference to FIGS. 16 to 19. In the example embodiments described with reference to FIGS. 16 to 19, the first transistor providing the first varactor element VAR1 may be larger than the second transistor providing the second varactor element VAR2, in each of the first unit capacitor block 611 and the second unit capacitor block 612. Also, a first transistor of the first unit capacitor block 611 may be larger than a first transistor of the second unit capacitor block 612. Accordingly, the capacitance difference that is adjustable in the first unit capacitor block 611 may be greater than the capacitance difference that is adjustable in the second unit capacitor block 612.

Figure 16:
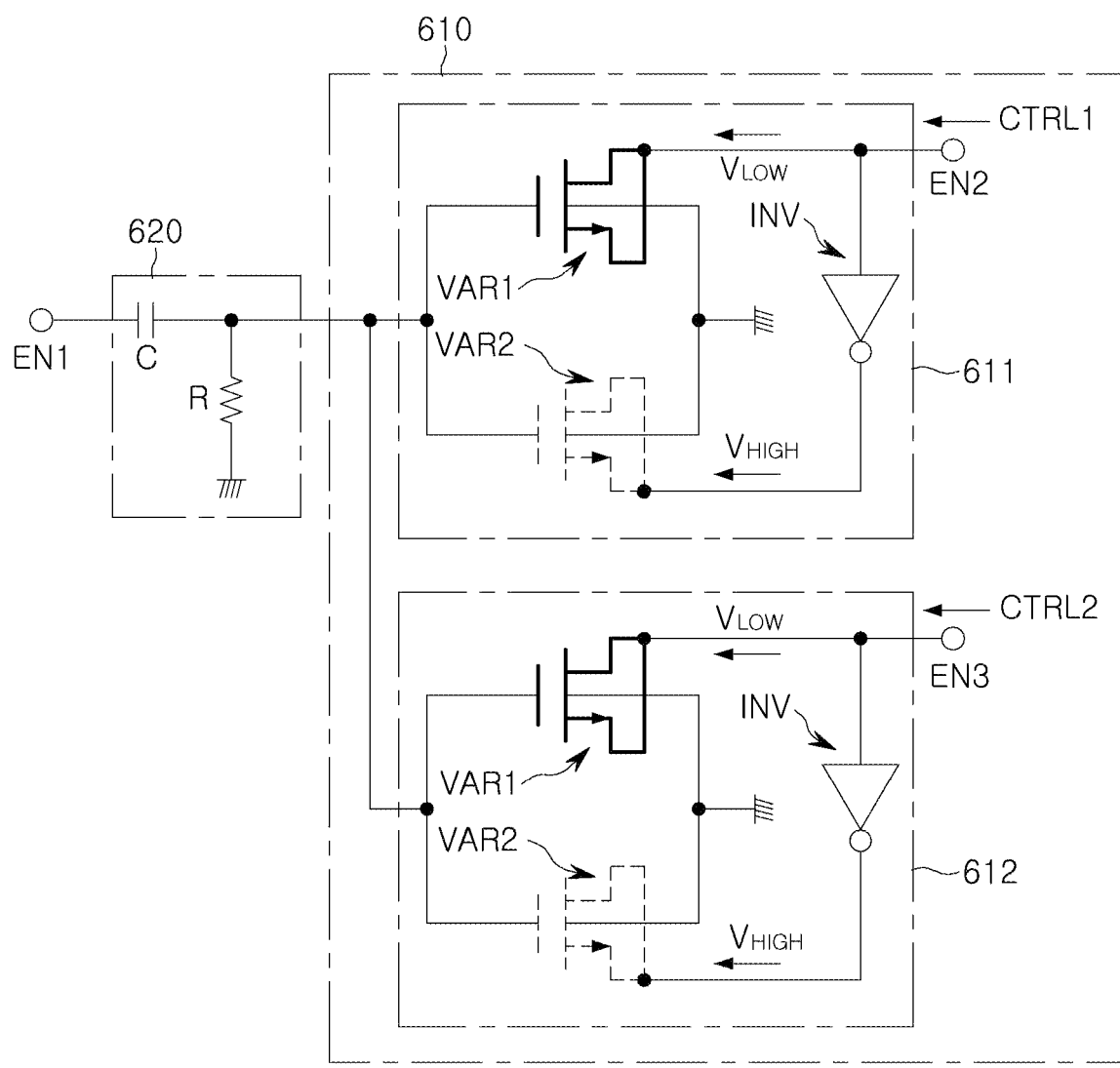

Referring to FIG. 16, each of the first control signal CTRL1 and the second control signal CTRL2 may have a low voltage level $V_{LOW}$ corresponding to a low logic value. Accordingly, in each of the first unit capacitor block 611 and the second unit capacitor block 612, the first varactor element VAR1 may operate in an accumulation mode and the second varactor element VAR2 may operate in a depletion mode.

Figure 17:
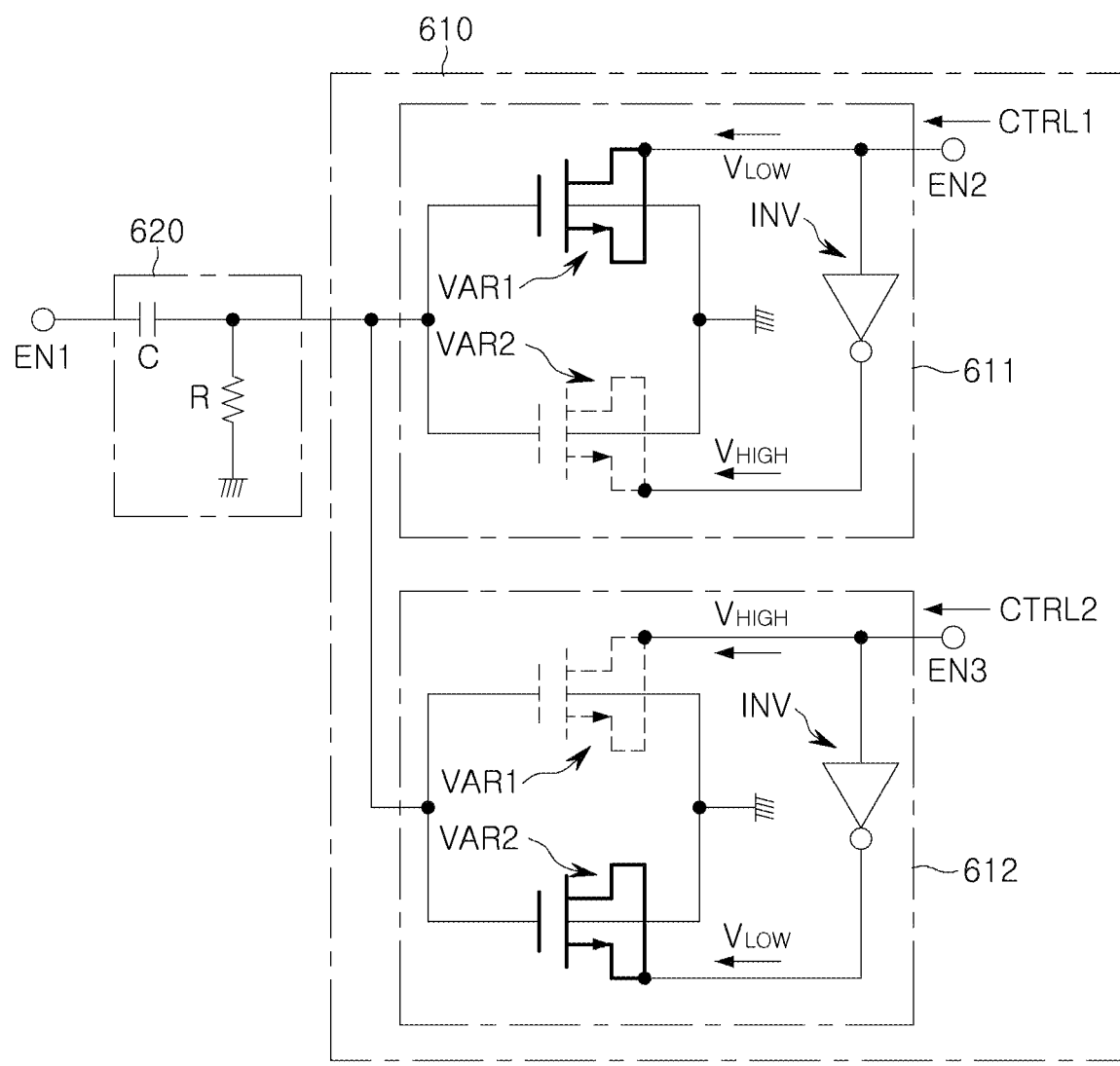

Referring to FIG. 17, the first control signal CTRL1 has a low voltage level $V_{LOW}$ corresponding to a low logic value, and the second control signal CTRL2 has a high voltage level $V_{HIGH}$ corresponding to a high logic value. Accordingly, in the first unit capacitor block 611, the first varactor element VAR1 may operate in an accumulation mode and the second varactor element VAR2 may operate in a depletion mode, and in the second unit capacitor block 612, the first varactor element VAR1 may operate in a depletion mode, and the second varactor element VAR2 may operate in an accumulation mode.

Figure 18:
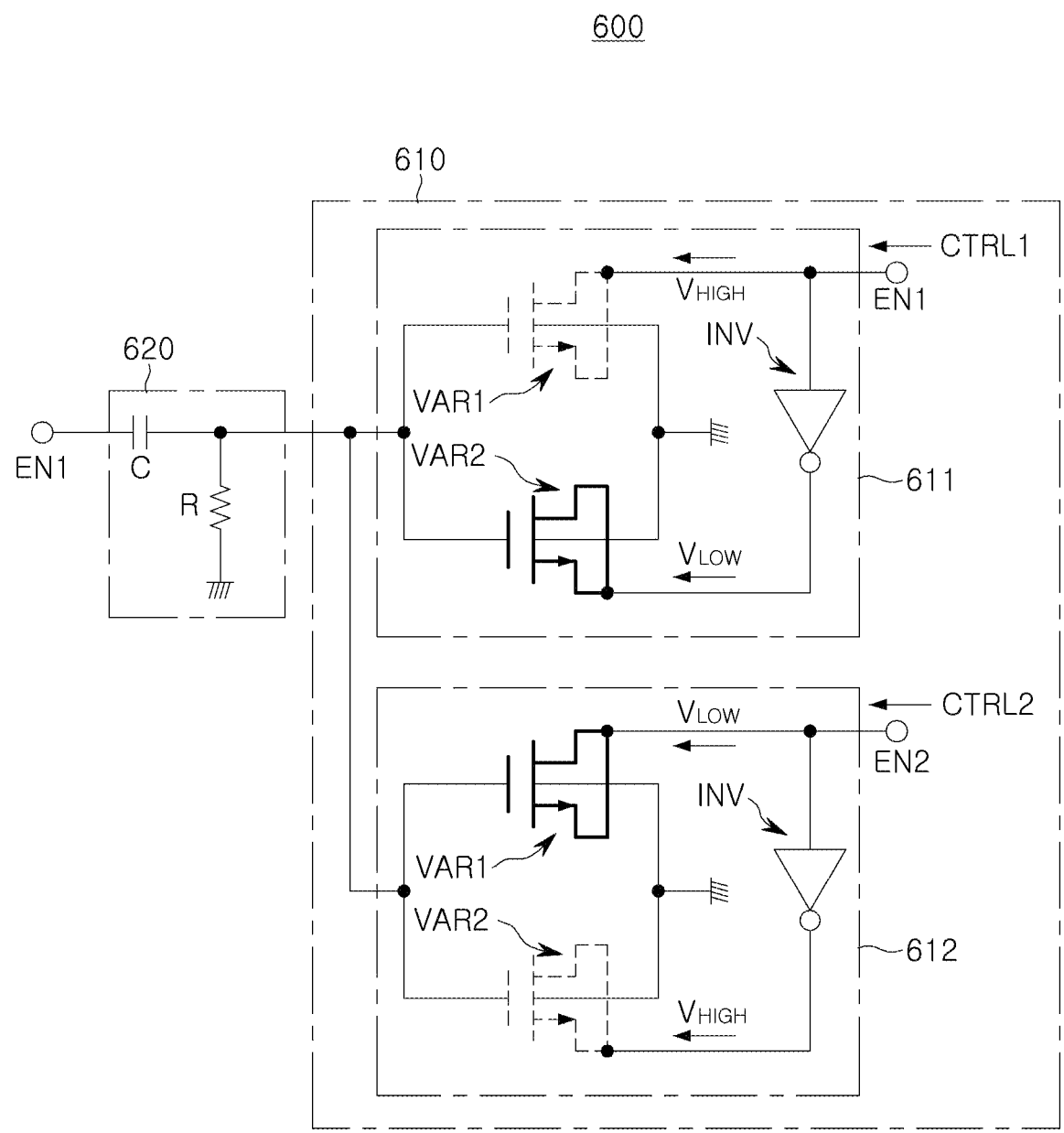

In an example embodiment of FIG. 18, the first control signal CTRL1 has a high voltage level $V_{HIGH}$ corresponding to a high logic value, and the second control signal CTRL2 has a low voltage level corresponding to a low logic value $V_{LOW}$. Accordingly, in the first unit capacitor block 611, the first varactor element VAR1 may operate in a depletion mode and the second varactor element VAR2 may operate in an accumulation mode, and in the second unit capacitor block 612, the first varactor element VAR1 may operate in an accumulation mode, and the second varactor element VAR2 may operate in a depletion mode.

Figure 19:
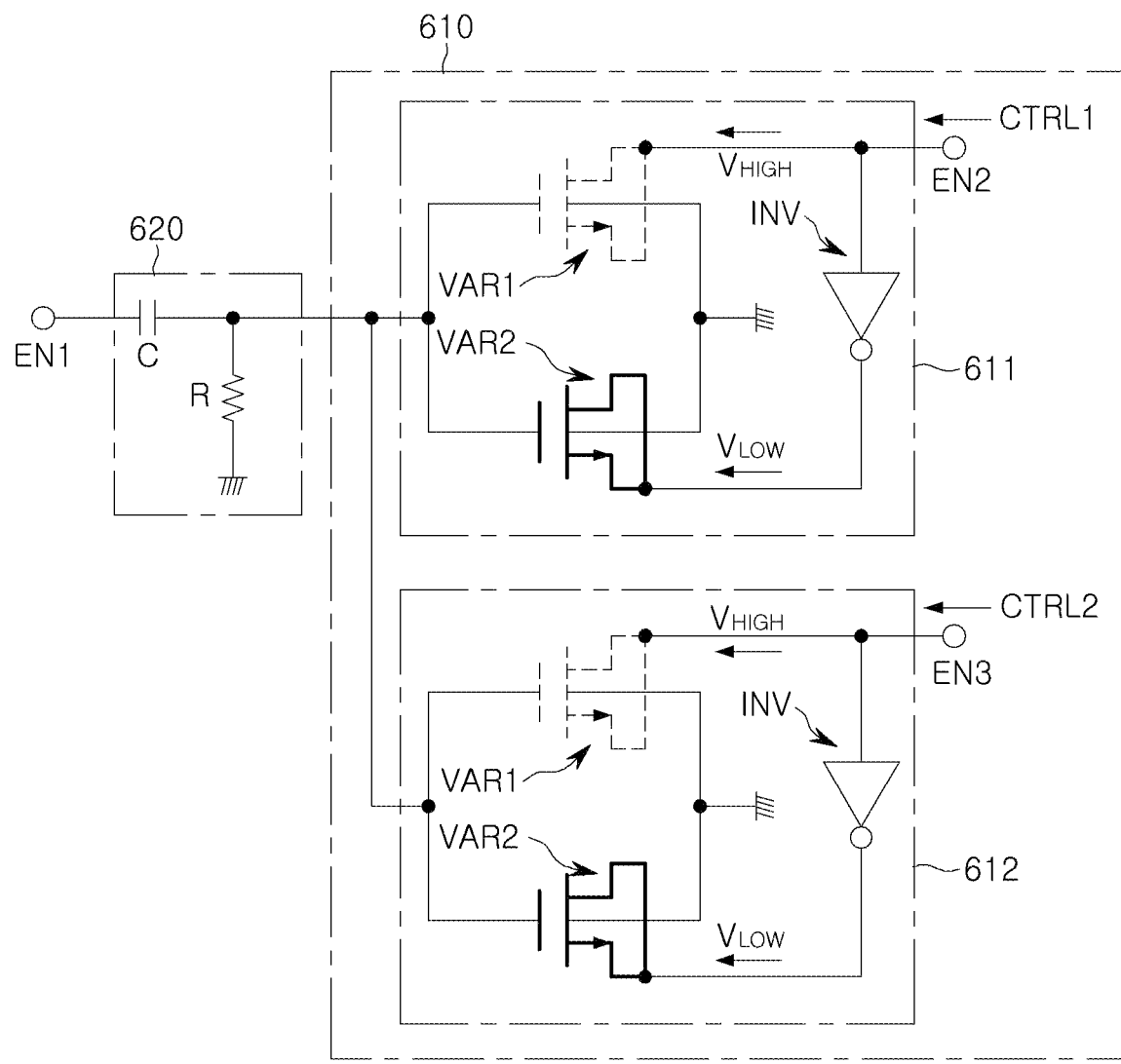

Referring to FIG. 19, each of the first control signal CTRL1 and the second control signal CTRL2 may have a high voltage level $V_{HIGH}$ corresponding to a high logic value. Accordingly, in each of the first unit capacitor block 611 and the second capacitor block 612, the first varactor element VAR1 may operate in a depletion mode and the second varactor element VAR2 may operate in an accumulation mode.

In the example embodiments described with reference to FIGS. 16 to 19, digital data determining the first control signal CTRL1 and the second control signal CTRL2, and the capacitance provided by the capacitor block 610 according to the digital data, may be determined as illustrated in Table 1 below. The first control signal CTRL1 and the second control signal CTRL2 may have a voltage determined by 2-bit digital data. For example, the voltage of the first control signal CTRL1 may be determined by the lower bit, and the control voltage of the second control signal CTRL2 may be determined by the higher bit.

TABLE 1

| Digital data | | 00 | 01 | 10 | 11 |
| --- | --- | --- | --- | --- | --- |
| First control signal | | $V_{LOW}$ | $V_{HIGH}$ | $V_{LOW}$ | $V_{HIGH}$ |
| Second control signal | | $V_{LOW}$ | $V_{LOW}$ | $V_{HIGH}$ | $V_{HIGH}$ |
| First unit capacitor block | First varactor element | Accumulation($C_{A11}$) | Depletion($C_{D11}$) | Accumulation($C_{A11}$) | Depletion($C_{D11}$) |
| | Second varactor element | Depletion($C_{D12}$) | Accumulation($C_{A12}$) | Depletion($C_{D12}$) | Accumulation($C_{A12}$) |
| Second unit capacitor block | First varactor element | Accumulation($C_{A21}$) | Accumulation($C_{A21}$) | Depletion($C_{D21}$) | Depletion($C_{D21}$) |
| | Second varactor element | Depletion($C_{D22}$) | Depletion($C_{D22}$) | Accumulation($C_{A22}$) | Accumulation($C_{A22}$) |
| Capacitance | | C1 | C2 | C3 | C4 |

As described above, in each of the first unit capacitor block 611 and the second unit capacitor block 612, the first transistor providing the first varactor element VAR1 It may have an area larger than that of the second transistor providing the second varactor element VAR2. Accordingly, referring to Table 1, when the digital data is 00, the capacitance C1 of the capacitor block 610 may have a maximum value, and when the digital data is 11, the capacitance C4 of the capacitor block 610 may have a minimum value. On the other hand, a case in which the first transistor providing the first varactor element VAR1 in the first unit capacitor block 611 is larger than the first transistor providing the first varactor element VAR1 in the second unit capacitor block 612 may be provided as an example, and in this case, the capacitance C2 when the digital data is 01 may be less than the capacitance C3 when the digital data is 10.

Figure 20:
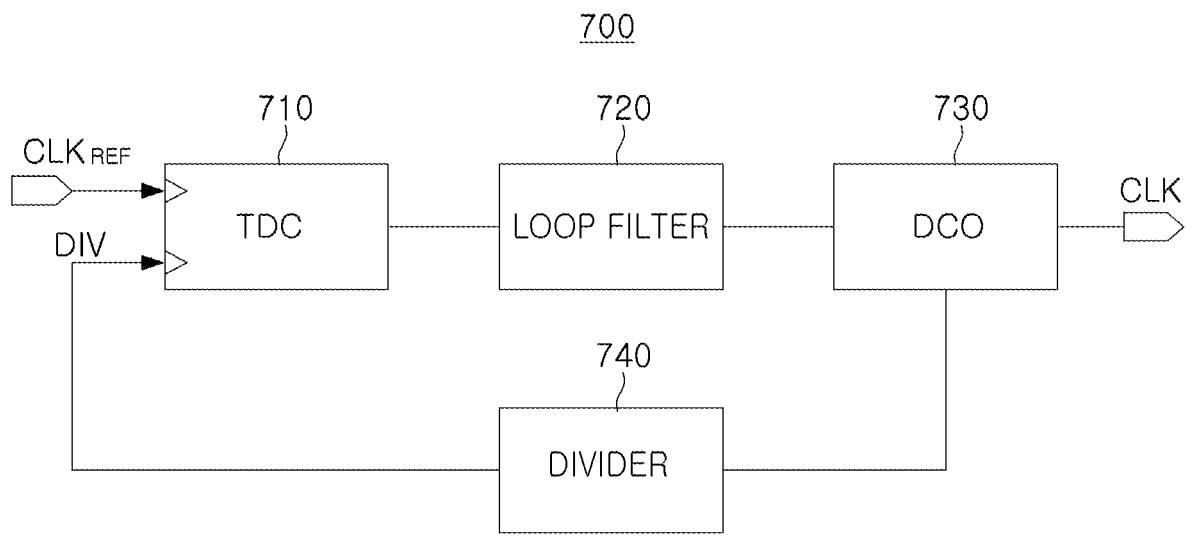
FIG. 20 is a diagram schematically illustrating a PLL circuit according to an example embodiment.

FIG. 20 is a diagram schematically illustrating a PLL circuit according to an example embodiment.

Referring to FIG. 20, a PLL circuit 700 may include a TDC 710, a loop filter 720, a DCO 730, and a divider 740.

The TDC 710 may receive a reference clock signal $CLK_{REF}$ and a division signal DIV and output a phase difference between the two signals as a digital code. The loop filter 720 may filter a phase error signal of the TDC 710 and output the phase error signal. The digitally-controlled oscillator (DCO) 730 may generate a clock signal CLK by using the filtered signal. The divider 740 divides the clock signal CLK output from the digitally-controlled oscillator 730 to generate a division signal DIV, and the division signal DIV may be input to the TDC 710. For example, the clock signal CLK output by the digitally-controlled oscillator 730 may be a signal having a frequency of several tens of GHz.

The digitally-controlled oscillator 730 may include an inductor circuit, a current mirror, a variable capacitor circuit, and the like. The inductor circuit may be connected to a first power node supplying the first supply voltage, and the current mirror may be connected between the current circuit supplying the bias current and the inductor circuit. The variable capacitor circuit may be one of the circuits according to the example embodiments described above with reference to FIGS. 1 to 19, and may be connected between the current mirror and the inductor circuit. The variable capacitor circuit may have capacitance determined by a control signal output by the loop filter 720 and corresponding to N-bit digital data.

Figure 21:
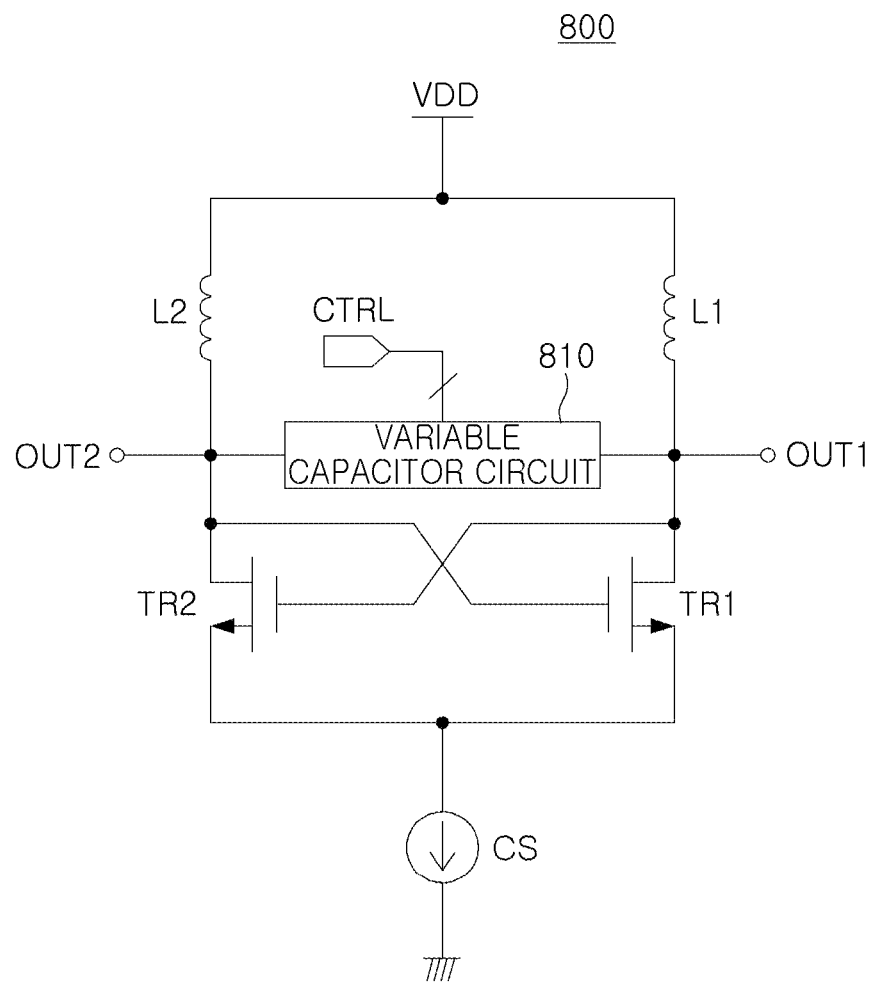
FIGS. 21 and 22 are diagrams schematically illustrating a digitally-controlled oscillator according to an example embodiment.
Figure 22:
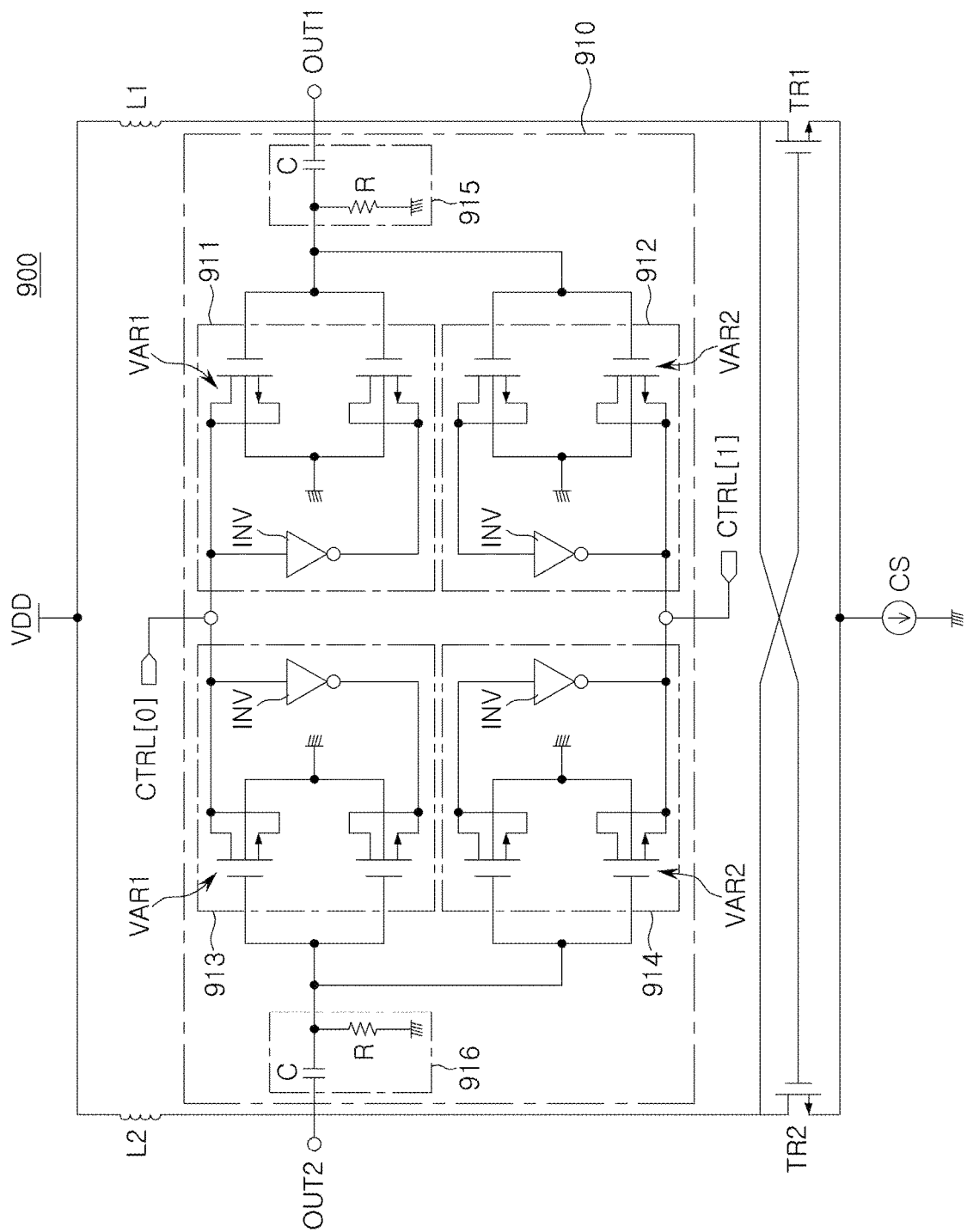

FIGS. 21 and 22 are diagrams schematically illustrating a digitally-controlled oscillator according to an example embodiment.

Referring first to FIG. 21, a digitally-controlled oscillator 800 may include an inductor circuit having a first inductor L1 and a second inductor L2 receiving a first power voltage VDD, a current mirror circuit including a first switch element TR1 and a second switch element TR2, a current source CS supplying a bias current, a variable capacitor circuit 810, and the like. The variable capacitor circuit 810 may be connected to an output node OUT1 between the first inductor L1 and the first switch element TR1 and a second output node OUT2 between the second inductor L2 and the second switch element TR2.

The variable capacitor circuit 810 may have a capacitance determined by the control signals CTRL. For example, the variable capacitor circuit 810 may include a first transistor providing the first varactor element and a second transistor providing the second varactor element. In an example embodiment, a gate of each of the first and second transistors is connected to the first output node OUT1, and a source and a drain of each of the first and second transistors may commonly receive one of the control signals CTRL. The first transistor and the second transistor may be connected to each other in parallel.

The variable capacitor circuit 810 may include a pair of varactor elements connected to the first output node OUT1 and a pair of varactor elements connected to the second output node OUT2. Hereinafter, the operation of the digitally-controlled oscillator 800 and the variable capacitor circuit 810 included in the digitally-controlled oscillator 800 will be described in more detail with reference to FIG. 22.

Referring to FIG. 22, a variable capacitor circuit 910 of a digitally-controlled oscillator 900 may include a first RC circuit 915 connected to a first output node OUT1 and a second RC circuit 916 connected to a second output node OUT2. The first RC circuit 915 may be connected to first and second unit capacitor blocks 911 and 912, and the second RC circuit 916 may be connected to third and fourth unit capacitor blocks 913 and 914.

The unit capacitor blocks 911-914 may (but do not necessarily) include circuits having a similar structure. In describing the first unit capacitor block 911 as an example, the first unit capacitor block 911 may include a first varactor element VAR1 and a second varactor element VAR2, connected to each other in parallel, and an inverter INV. In this case, the first varactor element VAR1 may be provided by a first transistor, and the second varactor element VAR2 may be provided by a second transistor.

Gates of the first transistor and the second transistor may be connected to the first output node OUT1 through the first RC circuit 915. The source and drain of the first transistor are connected to each other to commonly receive a first control signal CTRL[0], and the source and drain of the second transistor are connected to each other to receive a signal output by the inverter INV in common. Accordingly, a complementary signal of the first control signal CTRL[0] may be input to the source and drain of the second transistor.

The size of the first transistor may be different from the size of the second transistor, in the first unit capacitor block 911. For example, in a case in which the first transistor is larger than the second transistor, when the first varactor element VAR1 operates in the accumulation mode and the second varactor element VAR2 operates in the depletion mode, the first unit capacitor block 911 may have a relatively greater capacitance. The second to fourth unit capacitor blocks 912-914 may be implemented with a circuit similar to that of the first unit capacitor block 911.

Referring to FIG. 22, the first unit capacitor block 911 and the third unit capacitor block 913 may receive a first control signal CTRL[0] in common. Also, the second unit capacitor block 912 and the fourth unit capacitor block 914 may receive a second control signal CTRL[1] in common. Each of the first control signal CTRL[0] and the second control signal CTRL[1] may have a voltage level determined by 2-bit digital data input to the digitally-controlled oscillator 900. For example, when the lower bit of the digital data is 0, the first control signal CTRL[0] may have a low voltage level, and when the lower bit of the digital data is 1, the first control signal CTRL[0] may have a high voltage level. When the upper bit of the digital data is 0, the second control signal CTRL[0] may have a low voltage level, and when the upper bit of the digital data is 1, the second control signal CTRL[0] may have a high voltage level.

An operation of each of the unit capacitor blocks 911-914 may be understood with reference to the example embodiments illustrated in FIGS. 1 to 19 above. For example, when [01] as digital data is input to the digitally-controlled oscillator 900, the first varactor elements VAR1 in the first and third capacitor blocks 911 and 913 may operate in the accumulation mode, and the second varactor elements VAR2 may operate in a depletion mode. On the other hand, in the second and fourth capacitor blocks 912 and 914, the first varactor elements VAR1 may operate in a depletion mode and the second varactor elements VAR2 may operate in an accumulation mode.

In at least some of the unit capacitor blocks 911-914, size differences between the first transistors providing the first varactor elements VAR1 and the second transistors providing the second varactor elements VAR2 may be different. For example, a size difference between the first transistor and the second transistor included in the first unit capacitor block 911 may be different from a size difference between the first transistor and the second transistor included in the second unit capacitor block 912. An adjustable capacitance difference in each of the unit capacitor blocks 911-914 may be determined according to a size difference between the first transistor and the second transistor. Accordingly, by configuring the first transistor and the second transistor to have different size differences in at least some of the unit capacitor blocks 911-914, capacitances of various magnitudes may be provided to the variable capacitor circuit 910, and capacitance may be adjusted with fine differences.

Figure 23:
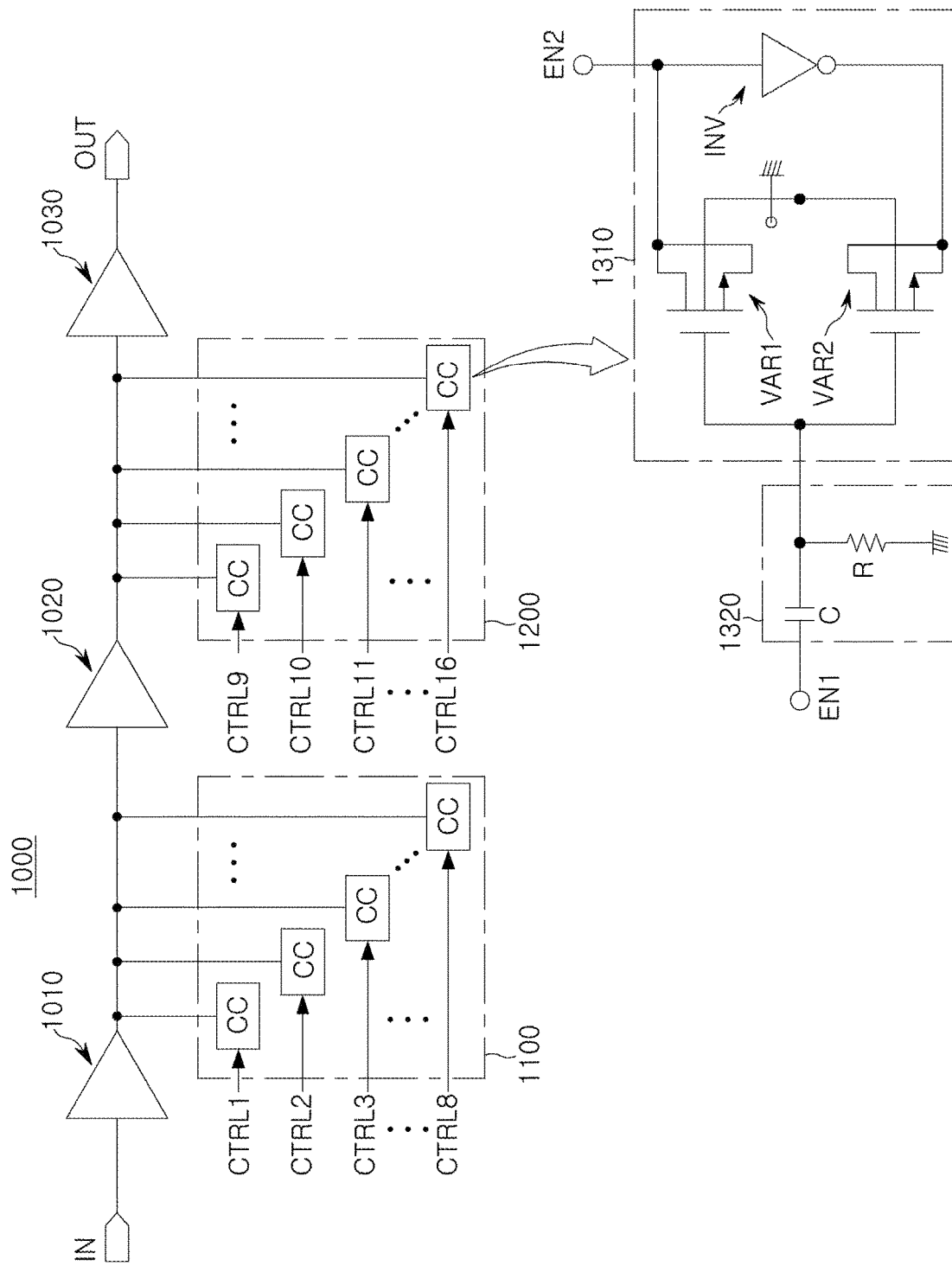
FIG. 23 is a diagram schematically illustrating a delay circuit according to an example embodiment.
Figure 24A:
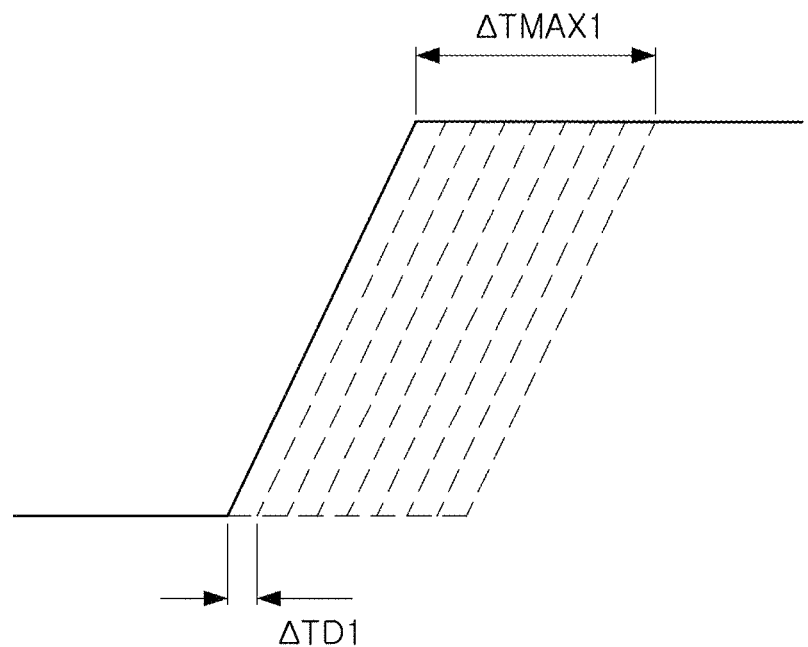
FIGS. 24A and 24B are diagrams provided to illustrate the operation of a delay circuit according to an example embodiment.
Figure 24B:
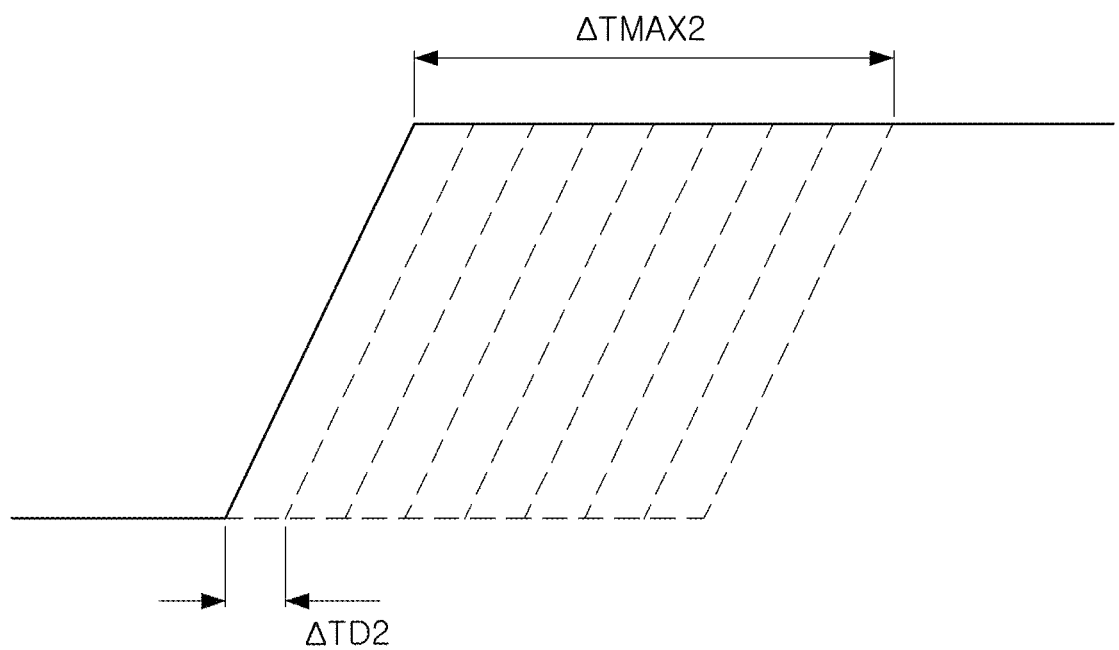

FIG. 23 is a diagram schematically illustrating a delay circuit according to an example embodiment. FIGS. 24A and 24B are diagrams provided to illustrate the operation of the delay circuit according to an example embodiment.

First, referring to FIG. 23, a delay circuit 1000 according to an example embodiment delays an input signal IN by a predetermined delay time to generate an output signal OUT having a phase different from that of the input signal IN. The delay circuit 1000 may include a plurality of buffers 1010-1030 and a plurality of variable capacitor circuits CC connected between the plurality of buffers 1010-1030. In the example embodiment illustrated in FIG. 23, variable capacitor circuits CC of a first group 1100 are connected between a first buffer 1010 and a second buffer 1020, and variable capacitor circuits CC of a second group 1200 may be connected between the second buffer 1020 and a third buffer 1030.

The delay amount of the delay circuit 1000 may be determined by capacitance of each of the variable capacitor circuits CC. For example, when the capacitance of the variable capacitor circuits CC increases, the delay amount of the delay circuit 1000 may increase, and a phase difference between the input signal IN and the output signal OUT may also increase.

Although the example embodiment illustrated in FIG. 23 Illustrates the case in which each of the first group 1100 and the second group 1200 is illustrated as including eight variable capacitor circuits CC, this is only an example embodiment, and the configuration is not necessarily limited thereto. The number of variable capacitor circuits CC may vary depending on a maximum delay amount to be implemented by the delay circuit 1000 and a unit delay amount to be controlled by the delay circuit 1000.

The variable capacitor circuits CC may be operated by control signals CTRL1-CTRL16. Each of the variable capacitor circuits CC may have a structure similar to that of the example embodiment described with reference to FIG. 10. For example, each of the variable capacitor circuits CC may include a capacitor block 1310 and an RC circuit 1320, and the capacitor block 1310 may include a pair of varactor elements VAR1 and VAR2. A first external node EN1 may be connected between a plurality of buffers 1010-1030, and one of the control signals CTRL1-CTRL16 may be input to a second external node EN2. As described above, each of the first varactor element VAR1 and the second varactor element VAR2 may operate in the accumulation mode or the depletion mode according to the voltage level of the control signal input to the second external node EN2.

In an example embodiment, each of the variable capacitor circuits CC may include the capacitor block 1310 and share one RC circuit 1320. For example, the variable capacitor circuits CC included in the first group 1100 share one RC circuit 1320, and the variable capacitor circuits CC included in the second group 1200 may share one RC circuit 1320.

In an example embodiment, a minimum delay amount adjustable by each of the variable capacitor circuits CC included in the first group 1100 may be different from a minimum delay amount adjustable by each of the variable capacitor circuits CC included in the second group 1200. Also, a maximum delay amount adjustable by the first group 1100 and a maximum delay amount adjustable by the second group 1200 may be different from each other. Accordingly, the phase difference between an input signal INT and an output signal OUT may be variously set by the delay circuit 1000, which will be described below in more detail with reference to FIGS. 24A and 24B.

FIG. 24A is a diagram illustrating an example adjustable delay amount for the first group 1100, and FIG. 24B is a diagram illustrating an example adjustable delay amount for the second group 1200. In detail, FIG. 24A is a diagram illustrating a phase difference between an output signal of the first buffer 1010 and an output signal of the second buffer 1020, and FIG. 24B is a diagram illustrating a phase difference between an output signal of the second buffer 1020 and an output signal of the third buffer 1030.

Referring to FIGS. 24A and 24B, a minimum delay amount adjustable in the first group 1100 may be a first unit delay amount $\Delta TD1$, and a minimum delay amount adjustable in the second group 1200 may be a second unit delay amount $\Delta TD2$. In the example embodiment described with reference to FIGS. 24A and 24B, the first unit delay amount $\Delta TD1$ may be less than the second unit delay amount $\Delta TD2$. When the numbers of variable capacitor circuits CC included in the first group 1100 and the second group 1200 are the same, a second maximum delay amount $\Delta TMAX2$ adjustable in the second group 1200 may be greater than a maximum delay amount $\Delta TMAX1$ that may be adjusted in first group 1100.

As a result, by using the control signals CTRL1-CTRL16 input to the variable capacitor circuits CC in each of the first group 1100 and the second group 1200, a phase difference between the input signal IN and the output signal OUT may be finely adjusted. In the example embodiment illustrated in FIGS. 24A and 24B, a minimum phase difference between the input signal IN and the output signal OUT may be determined as a first unit delay amount $\Delta TD1$, and a maximum phase difference between the input signal IN and the output signal OUT may be determined as a sum of the first maximum delay amount $\Delta TMAX1$ and the second maximum delay amount $\Delta TMAX2$.

As set forth above, according to an example embodiment, a variable capacitor circuit may be implemented in which capacitance may be finely adjusted using two or more varactor elements having different sizes, and a Q-factor may be improved by adding an RC circuit. Each of the varactor elements is set to one of an accumulation mode and a depletion mode according to a control signal, thereby significantly reducing an influence of variables or variability occurring in a manufacturing process.

While example embodiments have been illustrated and described above, it will be apparent to those skilled in the art that modifications and variations could be made without departing from the scope of the present inventive concept as defined by the appended claims.

What is claimed is:

1. A variable capacitor circuit comprising:
a capacitor block including a first varactor element comprising a first transistor having a first size, a second varactor element comprising a second transistor having a second size different from the first size, and an inverter having a first terminal commonly connected to a source and a drain of the first transistor, and a second terminal commonly connected to a source and a drain of the second transistor,
wherein the first varactor element and the second varactor element are connected to each other in parallel, and
wherein the first transistor is free from a direct connection in series to other transistors within the first varactor element, and the second transistor is free from a direct connection in series to other transistors within the second varactor element; and
an RC circuit connected to a gate of the first transistor and a gate of the second transistor.

2. The variable capacitor circuit of claim 1, wherein the first transistor and the second transistor are different from each other in at least one of a channel length, a channel width, or a number of fin structures providing a channel.

3. The variable capacitor circuit of claim 1, wherein the RC circuit is connected to a first external node, and the first terminal is connected to a second external node different from the first external node, and
wherein the variable capacitor circuit is configured to be connected to one or more external elements by the first external node and the second external node.

4. The variable capacitor circuit of claim 1, wherein the capacitor block comprises a plurality of unit capacitor blocks, and the plurality of unit capacitor blocks respectively comprise the first varactor element, the second varactor element, and the inverter.

5. The variable capacitor circuit of claim 4, wherein the plurality of unit capacitor blocks are connected to each other in parallel.

6. The variable capacitor circuit of claim 4, wherein the plurality of unit capacitor blocks comprise a first unit capacitor block and a second unit capacitor block, and
wherein the first varactor element of the first unit capacitor block and the first varactor element of the second unit capacitor block have different sizes.

7. The variable capacitor circuit of claim 6, wherein the second varactor element of the first unit capacitor block and the second varactor element of the second unit capacitor block have different sizes.

8. The variable capacitor circuit of claim 4, wherein the plurality of unit capacitor blocks comprise a first unit capacitor block and a second unit capacitor block, and
wherein a first external node to which the source and the drain of the first transistor of the first varactor element included in the first unit capacitor block are connected is different from a second external node to which the source and the drain of the first transistor of the first varactor element included in the second unit capacitor block are connected.

9. The variable capacitor circuit of claim 4, wherein the plurality of unit capacitor blocks are commonly connected to the RC circuit.

10. A variable capacitor circuit comprising:
a first varactor element comprising a first transistor having a first size and configured to operate responsive to a first control signal commonly applied to a source and a drain of the first transistor; and
a second varactor element comprising a second transistor having a second size and configured to operate responsive to a second control signal commonly applied to a source and a drain of the second transistor,
wherein the first transistor is free from a direct connection in series to other transistors within the first varactor element,
wherein the second transistor is free from a direct connection in series to other transistors within the second varactor element, and
wherein the second size is different from the first size, and the second control signal is a complementary signal of the first control signal.

11. The variable capacitor circuit of claim 10, wherein the first and second varactor elements are configured to operate in one of an accumulation mode or a depletion mode based on respective values of the first and second control signals,
wherein when the first varactor element is configured to operate in the accumulation mode, the second varactor element is configured to operate in the depletion mode, and
when the first varactor element is configured to operate in the depletion mode, the second varactor element is configured to operate in the accumulation mode.

12. The variable capacitor circuit of claim 11, wherein the first varactor element and the second varactor element are included in a capacitor block, and the first size of the first transistor is smaller than the second size of the second transistor, and
wherein a capacitance of the capacitor block has a minimum value when the first varactor element is configured to operate in the accumulation mode and the second varactor element is configured to operate in the depletion mode, and has a maximum value when the first varactor element is configured to operate in the depletion mode and the second varactor element is configured to operate in the accumulation mode.

13. The variable capacitor circuit of claim 12, wherein a difference between the maximum value and the minimum value is proportional to a difference between the first size of the first transistor and the second size of the second transistor.

14. The variable capacitor circuit of claim 10, wherein the first and second varactor elements are configured to operate in one of a depletion mode or an accumulation mode based on first and second logic values,
wherein when the first control signal has a first voltage level corresponding to the first logic value, the first varactor element is configured to operate in the depletion mode and the second varactor element is configured to operate in the accumulation mode, and
when the first control signal has a second voltage level that is less than the first voltage level and corresponds to the second logic value, the first varactor element is configured to operate in the accumulation mode and the second varactor element is configured to operate in the depletion mode.

15. The variable capacitor circuit of claim 10, further comprising:
an inverter connected between the source and the drain of the first transistor and the source and the drain of the second transistor, and configured to receive the first control signal and output the second control signal.

* * * * *